United States Patent
Yasuike

(10) Patent No.: US 8,299,689 B2
(45) Date of Patent: Oct. 30, 2012

(54) QUARTZ CRYSTAL RESONATOR ELEMENT, QUARTZ CRYSTAL DEVICE, AND METHOD FOR PRODUCING QUARTZ CRYSTAL RESONATOR ELEMENT

(75) Inventor: Ryoichi Yasuike, Hadano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/216,735

(22) Filed: Aug. 24, 2011

(65) Prior Publication Data

US 2011/0304406 A1 Dec. 15, 2011

Related U.S. Application Data

(63) Continuation of application No. 12/345,247, filed on Dec. 29, 2008, now Pat. No. 8,026,652.

(30) Foreign Application Priority Data

Dec. 28, 2007 (JP) ................................. 2007-341003

(51) Int. Cl.
*H03H 9/19* (2006.01)
(52) U.S. Cl. ......................... 310/361; 310/367; 310/368
(58) Field of Classification Search .................. 310/361, 310/367, 368
See application file for complete search history.

(56) References Cited

U.S. PATENT DOCUMENTS

| | | | |
|---|---|---|---|
| 4,313,071 A | 1/1982 | Hermann et al. | |
| 6,707,234 B1 * | 3/2004 | Kawashima | 310/367 |
| 6,976,295 B2 | 12/2005 | Kikushima et al. | |
| 2002/0060509 A1 | 5/2002 | Kawashima | |

(Continued)

FOREIGN PATENT DOCUMENTS

JP   A-2000-278080   10/2000

(Continued)

OTHER PUBLICATIONS

Ratajski, "The Force Sensitivity of At-Cut Quartz Crystals", 20th Annual Symposium on Frequency Control, (1966).

(Continued)

*Primary Examiner* — Walter Benson
*Assistant Examiner* — Bryan Gordon
(74) *Attorney, Agent, or Firm* — Oliff & Berridge, PLC

(57) ABSTRACT

A quartz crystal resonator element includes an AT-cut quartz crystal substrate, the substrate having edges parallel to each of a Z" axis obtained by rotating a Z' axis in a range of −120° to +60° about a Y' axis and an X' axis perpendicular to the Z" axis when an angle formed by rotating a +Z' axis in a direction of a +X axis about the Y' axis is a positive rotation angle; a thin section that forms a resonating section; and a thick section adjacent to the resonating section, the thin section and the thick section being formed on the quartz crystal substrate by wet etching. The thin section is formed either on a main surface of the substrate corresponding to a +Y'-axis side or on a main surface of the substrate corresponding to a −Y'-axis side. When the thin section is formed by the etching on the main surface of the +Y'-axis side, the thick section is provided at least a +Z"-axis-side end of the thin section, whereas when the thin section is formed by the etching on the main surface of the −Y'-axis side, the thick section is provided at least a −Z"-axis-side end of the thin section.

12 Claims, 21 Drawing Sheets

U.S. PATENT DOCUMENTS

| | | | |
|---|---|---|---|
| 2003/0056590 A1* | 3/2003 | Yanagisawa et al. | 73/504.16 |
| 2005/0162048 A1* | 7/2005 | Solal et al. | 310/360 |
| 2007/0075611 A1* | 4/2007 | Kawashima | 310/361 |
| 2008/0203858 A1* | 8/2008 | Onoe et al. | 310/361 |
| 2008/0284281 A1* | 11/2008 | Kawashima | 310/313 R |

FOREIGN PATENT DOCUMENTS

| | | |
|---|---|---|
| JP | A-2000-295064 | 10/2000 |
| JP | A-2001-144578 | 5/2001 |
| JP | A-2002-033640 | 1/2002 |
| JP | A-2002-246869 | 8/2002 |
| JP | A-2002-299991 | 10/2002 |
| JP | A-2006-203700 | 8/2006 |

OTHER PUBLICATIONS

Feb. 8, 2011 Office Action issued in U.S. Appl. No. 12/345,247.
May 23, 2011 Office Action issued in U.S. Appl. No. 12/345,247.

* cited by examiner

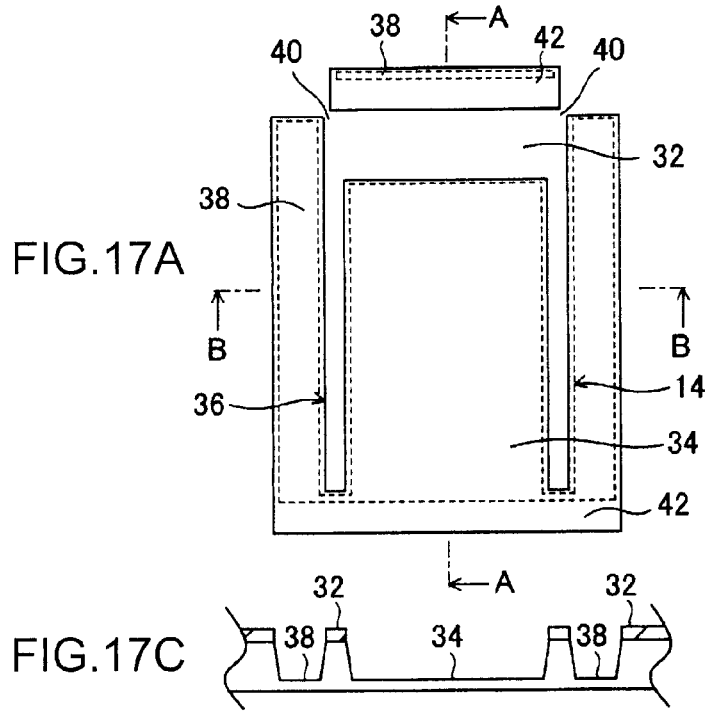
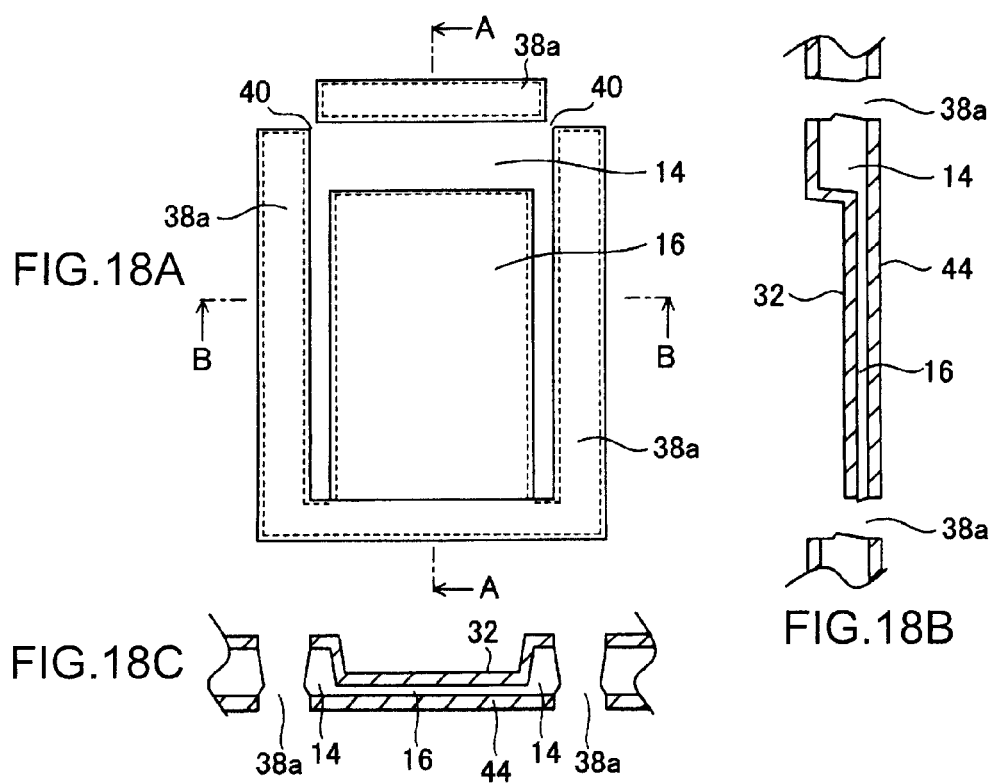

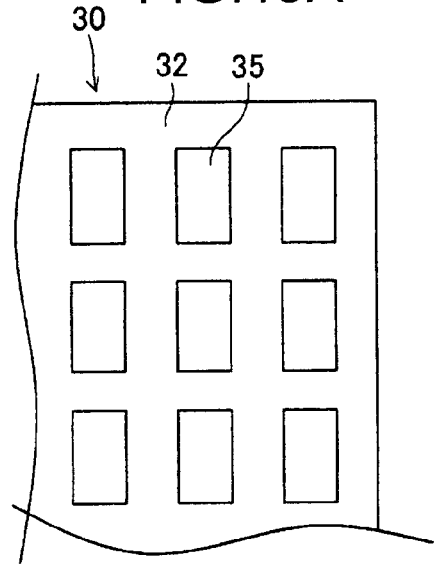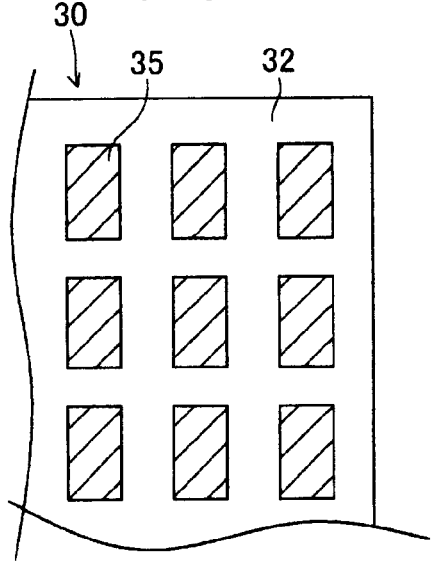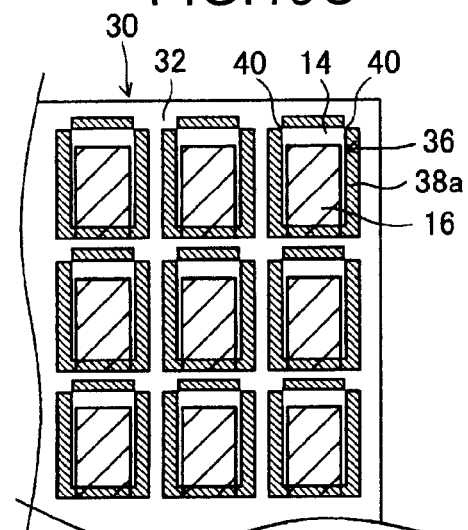

QUARTZ CRYSTAL RESONATOR ELEMENT, QUARTZ CRYSTAL DEVICE, AND METHOD FOR PRODUCING QUARTZ CRYSTAL RESONATOR ELEMENT

This is a Continuation of application Ser. No. 12/345,247 filed Dec. 28, 2008. The disclosure of the prior application is hereby incorporated by reference herein in its entirety.

BACKGROUND

1. Technical Field

The present invention relates to a quartz crystal resonator element, a quartz crystal device including the quartz crystal resonator element, and a method for producing the quartz crystal resonator element. Particularly, the invention relates to a quartz crystal resonator element suitable to increase a space occupied by a thin section effective to promote excitation in production of an inverted mesa-type quartz crystal resonator element or the like, as well as relates to a quartz crystal device including the quartz crystal resonator element, and to a method for producing the quartz crystal resonator element.

2. Related Art

The inverted mesa-type quartz crystal resonator element is adaptable for high-frequency use while securing mechanical strength in a quartz crystal resonator element. In the recent years, there has been an increased demand for miniaturization of the inverted mesa-type quartz crystal resonator element. However, smaller and thinner quartz crystal resonator elements often cause two major problems: a problem due to the resonator element itself and a problem occurring between the resonator element and other constituent components in production of a quartz crystal device. Of the above problems, the resonator element-related problem can be described as follows.

For example, there is a difficulty in securing a space for providing a thin section as a resonating section. Specifically, to form a configuration of an increasingly smaller quartz crystal resonator element, wet etching is often used because of its high mass productivity. However, wet etching of quartz crystal is influenced by crystallographic orientation of quartz crystal. When producing the inverted mesa-type quartz crystal resonator element, the etching rate varies depending on each crystal face appearing on an etched surface. As a result, etching residues form an inclined face (a crystal face) around the thin resonating section.

As a quartz crystal substrate used in the resonator element is smaller, an amount of the residues appearing from a thick section to the thin section is increased, whereby an effective area of the thin resonating section is reduced. This also results in reduction of a size of an excitation electrode. With an extremely small excitation electrode, a stable signal cannot be extracted from the quartz crystal, or sufficient energy trap cannot be expected. Thus, a graph of frequency-temperature characteristics sometimes shows influence of stress or the like from a supporting portion, or active dips.

In order to solve those problems, for example, JP-A-2002-33640 and JP-A-2001-144578 disclose techniques for increasing a space for the thin section in the inverted mesa-type quartz crystal resonator element.

Regarding the inverted mesa-type quartz crystal resonator element provided in JP-A-2002-33640, an unnecessary part of the thick section is cut by dicing after producing the resonator element.

Additionally, in the inverted mesa-type quartz crystal resonator element disclosed in JP-A-2001-144578, a thin section is formed by grinding and the resonator element is individually obtained by dicing.

On the other hand, the problem between a quartz crystal resonator element and other components in a quartz crystal device is as follows. For example, stress generated by mounting a quartz crystal resonator element on a package or a substrate has influence on frequency characteristics. Specifically, when the quartz crystal resonator element is mounted on the package or the substrate using a conductive adhesive or a bump, the resonator element is influenced by stress loaded onto the package or the substrate or stress due to a difference in linear expansion coefficient between quartz crystal and the package or the substrate. In this case, the resonator element causes deviation in its frequency characteristics.

The influence of the problems above becomes greater as quartz crystal resonator elements become smaller and thinner. Thus, studies have been promoted regarding a relationship between frequency characteristic changes and stress (stress sensitivity). As a result of the studies, for example, there is provided a document "The Force Sensitivity of At-cut Quartz Crystals" (J. M. Ratajski, 1966) that describes stress sensitivity of an AT-cut quartz crystal substrate. The document shows that, on the AT-cut quartz crystal substrate, a direction having a lowest stress sensitivity is a direction in which an X axis as a crystallographic axis is rotated by 60° or 120° in a direction from a −X axis to a −Z' axis about a Y' axis.

The inverted mesa-type quartz crystal resonator elements disclosed in the above patent documents surely increase the space occupied by the thin section. However, the resonator elements both require machine processing to produce the resonator elements. Accordingly, mass productivity is reduced as compared to a quartz crystal resonator element produced using only wet etching.

SUMMARY

Therefore, an advantage of the present invention is to provide an inverted mesa-type quartz crystal resonator element that has a high mass productivity and allows a resonating section to occupy a large space, a quartz crystal device including the quartz crystal resonator element, and a method for producing the quartz crystal resonator element.

The invention has been accomplished to solve at least a part of the problems described above and can be implemented in following aspects.

A quartz crystal resonator element according to a first aspect of the invention includes an AT-cut quartz crystal substrate, the substrate having edges parallel to each of a Z" axis obtained by rotating a Z' axis in a range of −120° to +60° about a Y' axis and an X' axis perpendicular to the Z" axis when an angle formed by rotating a +Z' axis in a direction of a +X axis about the Y' axis is a positive rotation angle; a thin section that forms a resonating section; and a thick section adjacent to the resonating section, the thin section and the thick section being formed on the quartz crystal substrate by wet etching. The thin section is formed either on a main surface of the substrate corresponding to a +Y'-axis side or on a main surface of the substrate corresponding to a −Y'-axis side. When the thin section is formed by the etching on the main surface of the +Y'-axis side, the thick section is provided at least a +Z"-axis-side end of the thin section, whereas when the thin section is formed by the etching on the main surface of the −Y'-axis side, the thick section is provided at least a −Z"-axis-side end of the thin section.

The quartz crystal resonator element structured as above has a high mass productivity and increases a space occupied by the thin resonating section on the quartz crystal substrate.

Preferably, in the quartz crystal resonator element of the first aspect, there is provided a non-thick-section-forming region at least one end of the thin section except for the end of the thin section at which the thick section is formed.

Providing no thick section at least one end of the thin section except for the end thereof adjacent to the thick section surely increases a space occupied by the thin section. In addition, also in this case, mass productivity is improved.

Preferably, in the quartz crystal resonator element of the first aspect, the Z' axis is rotated in a range of −60° to −25°; and when the etching is performed on the main surface of the +Y'-axis side, the thick section is provided at each of the +Z"-axis-side end and a +X'-axis-side end of the thin section and a non-thick-section-forming region is provided at each of the −Z"-axis-side end and a −X'-axis-side end of the thin section, whereas when the etching is performed on the main surface of the −Y'-axis side, the thick section is provided at each of the −Z"-axis-side end and the −X'-axis-side end of the thin section, as well as the non-thick-section-forming region is provided at each of the +Z"-axis-side end and the +X'-axis-side end of the thin section.

In the quartz crystal resonator element featured as above, mass productivity is improved and the resonating section occupies more space on the quartz crystal substrate. Furthermore, the resonator element secures sufficient mechanical strength.

Preferably, in the quartz crystal resonator element of the first aspect, the Z' axis is rotated in a range of −35° to 0°; and when the etching is performed on the main surface of the +Y'-axis side, the thick section is provided at each of the +Z"-axis-side end and a −X'-axis-side end of the thin section and a non-thick-section-forming region is provided at each of the −Z"-axis-side end and a +X'-axis-side end of the thin section, whereas when the etching is performed on the main surface of the −Y'-axis side, the thick section is provided at each of the −Z"-axis-side end and the +X'-axis-side end of the thin section and the non-thick-section-forming region is provided at each of the +Z"-axis-side end and the −X'-axis-side end of the thin section.

In the quartz crystal resonator element featured as above, similarly, mass productivity is improved, and the space for the resonating section on the quartz crystal substrate is increased. In addition, the above resonator element secures sufficient mechanical strength.

Preferably, in the quartz crystal resonator element of the first aspect, the Z' axis is rotated in a range of −30°±5°; and when the etching is performed on the main surface of the +Y'-axis side, the thick section is provided at each of the +Z"-axis-side end and ±X'-axis-side ends of the thin section and a non-thick-section-forming region is provided at the −Z"-axis-side end of the thin section, whereas when the etching is performed on the main surface of the −Y'-axis side, the thick section is provided at each of the −Z"-axis-side end and the ±X'-axis-side ends of the thin section and the non-thick-section-forming region is provided at the +Z"-axis-side end of the thin section.

In the quartz crystal resonator element featured as above, similarly, mass productivity is improved, and the space occupied by the resonating section on the substrate is increased. In addition, the resonator element secures sufficient mechanical strength.

Preferably, in the quartz crystal resonator element of the first aspect, the Z' axis is rotated in a range of −30°±5°; and the thick section is provided at a part of an outer periphery of each of ±X'-axis-side edges.

In the quartz crystal resonator element featured as above, similarly, mass productivity is improved, and the resonating section occupies more space on the substrate. In addition, the resonator element secures sufficient mechanical strength.

Preferably, in the quartz crystal resonator element of the first aspect, the Z' axis is rotated in a range of −30°±5°; and the resonator element further includes an electrode pattern arranged on the quartz crystal substrate, the electrode pattern including at least one connection electrode arranged on a straight line parallel to the Z" axis.

The quartz crystal resonator element featured as above is hardly influenced by external stress when mounted in a package.

Preferably, the quartz crystal resonator element of the first aspect further includes a plurality of excitation electrodes formed on the resonating section provided on one of the main surfaces of the substrate.

The quartz crystal resonator element featured as above can be incorporated as a device in a dual-mode filter.

A quartz crystal device according to a second aspect of the invention includes the quartz crystal resonator element of the first aspect in a package.

The above structure provides a quartz crystal resonator or a quartz crystal filter.

A quartz crystal device according to a third aspect of the invention includes the quartz crystal resonator element of the first aspect and an oscillation circuit that allows excitation of the quartz crystal resonator element.

The above structure can provide a quartz crystal oscillator as an example of the quartz crystal device.

According to a fourth aspect of the invention, there is provided a method for producing a quartz crystal resonator element by using a wafer having edges parallel to each of a Z" axis obtained by rotating a Z' axis in a range of −120° to +60° about a Y' axis and an X' axis perpendicular to the Z" axis on an AT-cut quartz crystal substrate when an angle formed by rotating a +Z' axis in a direction of a +X axis about the Y' axis is a positive rotation angle. The method includes performing a first etching process using wet etching. In the first etching process, when the etching is performed on a main surface of the substrate corresponding to a +Y'-axis side, there are provided a thin-section-forming region that forms a resonating section, an outer periphery of a thick-section-forming region adjacent to the thin-section-forming region, and an outer periphery of a non-thick-section-forming region provided at least a −Z"-axis-side end of the thin-section-forming region, whereas when the etching is performed on a main surface of the substrate corresponding to a −Y'-axis side, there are provided a thin-section-forming region that forms a resonating section, an outer periphery of a thick-section-forming region adjacent to the thin-section-forming region, and an outer periphery of a non-thick-section-forming region provided at least a +Z"-axis-side end of the thin-section-forming region. The method further includes performing a second etching process using wet etching, the second etching process penetrating the outer periphery of the thick-section-forming region and the outer periphery of the non-thick-section-forming region in a Y'-axis direction by the etching.

The production method featured as above allows an outline configuration of the quartz crystal resonator element of the first aspect to be formed by only the two etching processes. Accordingly, the configuration of the resonator element can be formed through a batch processing using wet etching, thereby improving mass productivity.

According to a fifth aspect of the invention, there is provided a method for producing a quartz crystal resonator element using a wafer having edges parallel to each of a Z" axis obtained by rotating a Z' axis in a range of −120° to +60° about a Y' axis and an X' axis perpendicular to the Z" axis on an AT-cut quartz crystal substrate when an angle formed by rotating a +Z' axis in a direction of a +X axis about the Y' axis is a positive rotation angle. The method includes performing a first etching process using wet etching. In the first etching process, when the etching is performed on a main surface of the substrate corresponding to a +Y'-axis side, there are provided a thin-section-forming region that forms a resonating section and an outer periphery of a non-thick-section-forming region provided at least a −Z"-axis-side end of the thin-section-forming region, whereas when the etching is performed on a main surface of the substrate corresponding to a −Y'-axis side, there are provided a thin-section-forming region that forms a resonating section and an outer periphery of a non-thick-section-forming region provided at least a +Z"-axis-side end of the thin-section-forming region. The method further includes performing a second etching process using wet etching, the second etching process penetrating the outer periphery of the thick-section-forming region and the outer periphery of the non-thick-section-forming region in a Y'-axis direction by the wet etching.

In the method featured as above, similarly, the outline configuration of the quartz crystal resonator element of the first aspect can be formed by only the two etching processes. Consequently, the configuration of the resonator element can be formed though the batch processing using wet etching, thereby improving mass productivity. Additionally, performing the second etching process to penetrate through both main surfaces of the wafer allows shapes of side surfaces of the quartz crystal resonator element to be adjusted appropriately.

BRIEF DESCRIPTION OF THE DRAWINGS

The invention will be described with reference to the accompanying drawings, wherein like numbers reference like elements.

FIGS. 17A to 17C are a plan view and sectional views of an individual-element-forming region upon completion of a first etching process in the production method according to the first embodiment.

FIGS. 18A to 18C are a plan view and sectional views of the individual-element-forming region upon completion of a second etching process in the production method according to the first embodiment.

FIGS. 19A to 19C are diagrams illustrating steps involved in a method for producing the quartz crystal resonator element according to a second embodiment of the invention.

DESCRIPTION OF EXEMPLARY EMBODIMENTS

Figure 1:
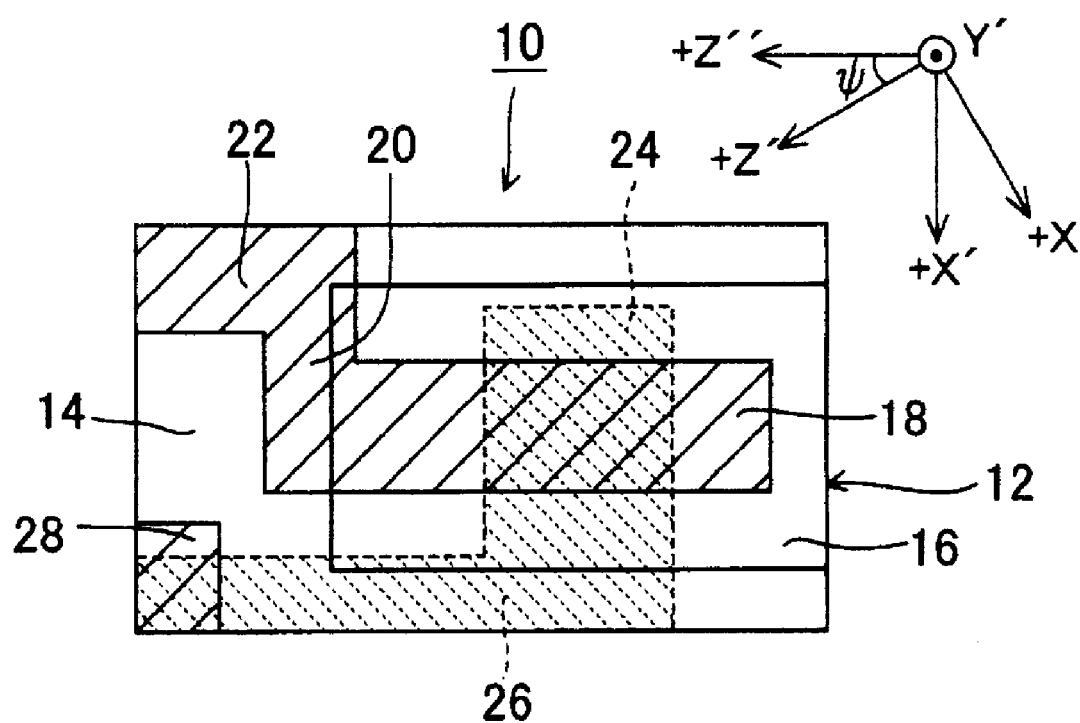
FIG. 1 is a diagram showing a structure of a quartz crystal resonator element according to a first embodiment of the invention.

Embodiments of the invention will be described in detail by referring to the drawings.

Figure 2A:
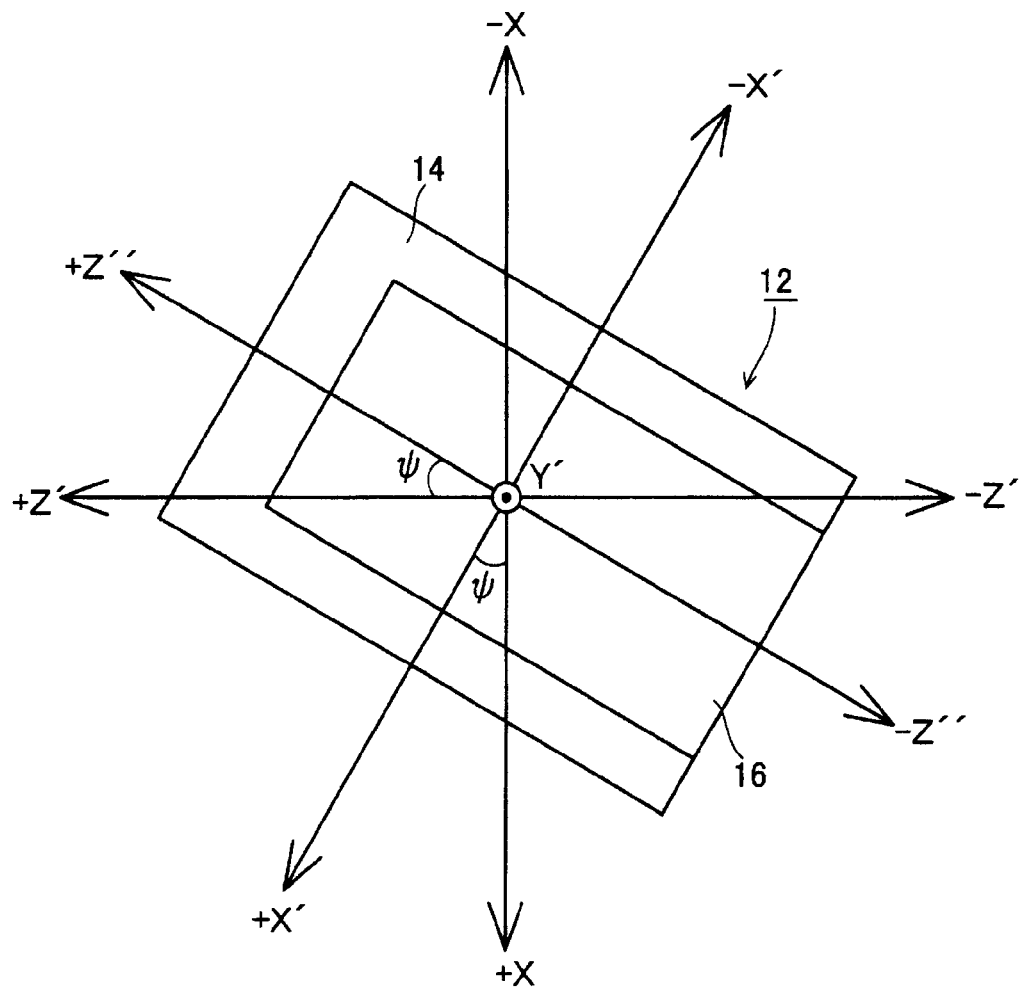
FIGS. 2A and 2B are diagrams showing a structure of a quartz crystal substrate.

First, a description will be given of a quartz crystal resonator element according to a first embodiment of the invention, with reference to FIGS. 1 to 21C. FIG. 2A is a schematic diagram showing a two-dimensional structure of a quartz crystal substrate used in the first embodiment, and FIG. 2B is a schematic diagram showing a cross-sectional structure of the quartz crystal substrate.

A quartz crystal resonator element 10 includes a quartz crystal substrate 12 and an electrode pattern formed on the quartz crystal substrate 12. In the quartz crystal resonator element 10 according to the first embodiment, the quartz crystal substrate 12 is a so-called in-plane rotated AT-cut quartz crystal substrate. The AT-cut quartz crystal substrate is cut out in such a manner that a plane including an X axis and a Z axis as crystallographic axes of quartz crystal (a Y plane) is a main surface obtained by rotating a +Z axis by approximately 35° 15' in a −Y-axis direction about the X axis as a reference point, namely a main surface including the X axis and a Z' axis. Additionally, on the main surface including the X axis and the Z' axis, when rotating a +Z' axis in a +X-axis direction about a Y' axis as a reference point is defined as having a positive rotation angle, the quartz crystal substrate 12 used in the embodiment has edges along (parallel to) an X' axis and an Z" axis obtained by rotating each of the X axis and the Z' axis by approximately −30°±5°. In general, a raw material of quartz crystal devices is a right-handed quartz crystal, although the embodiment can also be applied to quartz crystal devices made of a left-handed quartz crystal. For example, when crystallographic axes are indicated with respect to a surface including the Z axis and the X axis, the left-handed quartz crystal has crystallographic axes that are in a mirror-image relationship with crystallographic axes of the right-handed quartz crystal. In this case, the right-handed and the left-handed quartz crystals have a same physical constant. Thus, as long as a rotation angle, a cutting angle, and the like are appropriately formed according to the crystallographic axes, a desired quartz crystal resonator element can be obtained by forming a quartz crystal substrate based on the above description and a below description, without any modification.

Figure 2B:
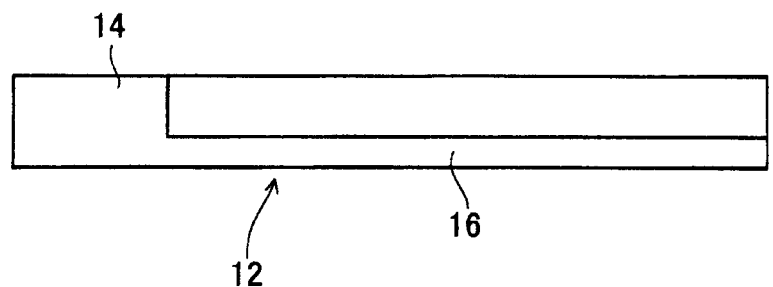

In the quartz crystal substrate 12 structured as shown in FIGS. 2A and 2B, the Z" axis can indicate a length direction of the substrate 12; the X' axis can indicate a width direction of the substrate; and the Y' axis can indicate a thickness direction of the substrate. Additionally, the quartz crystal substrate 12 of the present embodiment includes a thin resonating section 16 and a thick fixed section 14 adjacent to the thin resonating section 16.

In wet etching of the quartz crystal substrate 12, anisotropy of crystallographic orientation of quartz crystal tends to cause an etching rate difference due to formation of crystal planes. Particularly, the AT-cut quartz crystal substrate often has residues appearing on a surface processed by wet etching (a presence of an inclined face). An amount of residues on the etched surface varies depending on various cutting-out angles such as a cutting angle and an in-plane rotation angle.

For example, when an ordinary AT-cut quartz crystal substrate is wet-etched to form an inverted mesa-type quartz crystal substrate, a relatively large amount of residues appear at two edge sides of the thin section, specifically, at a −Z'-axis-side stepped portion and a +X-axis-side stepped portion. On the other hand, in wet etching of the quartz crystal substrate 12 of the embodiment cut out at an in-plane rotation angle to obtain an inverted mesa-type quartz crystal substrate, a large amount of residues appear only at a single edge side of a −Z"-axis side. Thus, using the quartz crystal substrate 12 thus formed can result in reduction of residues appearing between the resonating section 16 and the thick section 14, thereby increasing an occupancy of the resonating section 16 effective to form the quartz crystal resonator element 10

Additionally, when forming an outline configuration of the quartz crystal substrate 12 of the embodiment, an end of the thin section on a side with the residues appearing (the −Z"-axis side) is determined as a non-thick-section-forming region, and a thick section is removed by wet etching. Removing a part of the thick section as above can lead to the removal of a cause of generating residues. This can increase a space occupied by the resonating section 16 on an entire area of the quartz crystal substrate 12 to form the quartz crystal resonator element 10.

Accordingly, in the quartz crystal substrate 12 of the embodiment, the thick section 14 adjacent to the thin resonating section 16 is provided in an approximately U-letter shape along edge sides except for the −Z"-axis side, since the quartz crystal resonator element 10 can maintain mechanical strength even in the structure as above.

The quartz crystal substrate 12 having the above outline configuration includes patterns of electrodes such as excitation electrodes 18 and 24, connection electrodes 22 and 28, and extraction electrodes 20 and 26. The electrode patterns provided on the quartz crystal substrate 12 of the embodiment will be described below with reference to the drawings.

First will be described a first electrode pattern by referring to FIG. 1. In the first electrode pattern, the excitation electrode 18 provided on an upper surface of the resonating section 16 is formed in a rectangular shape with long edge sides in a Z"-axis direction, and the excitation electrode 24 provided on a lower surface of the resonating section 16 is formed in a rectangular shape with long edge sides in an X'-axis direction. Then, the rectangular excitation electrodes 18 and 24 intersect with each other via the upper and the lower surfaces of the resonating section 16 such that parts of the excitation electrodes 18 and 24 overlap with each other via the upper and the lower surfaces thereof. This structure can maintain a space of an overlapping region of the excitation electrodes 18 and 24 contributing to excitation, even if any deviation occurs between the excitation electrodes 18 and 24 provided on the lower and the upper surfaces of the resonating section 16. As a result, in mass production of the quartz crystal resonator element 10, differences in oscillation characteristics can be reduced.

The connection electrodes 22 and 28 are formed along edge sides of the thick section 14 provided on the +Z"-axis side to be electrically connected to the excitation electrodes 18 and 24 via the extraction electrodes 20 and 26. In each of the extraction electrodes 20 and 26, desirably, a portion of the each electrode straddling a stepped portion between the thick section 14 and the thin section 16 may have a large line width. The structure can prevent disconnection of the extraction electrodes 20 and 26 occurring at the stepped portion between the resonating section 16 and the thick section 14 where a metal film forming the electrode patterns tends to be thinner. In the embodiment, the extraction electrode 20 is extended to a −X'-axis-side edge in a manner straddling the stepped portion from the excitation electrode 18 arranged up to the stepped portion along a Z"-axis direction, and then connected to the connection electrode 22 along the −X'-axis-side edge. The extraction electrode 26 is extended from the excitation electrode 24 arranged up to a +X'-axis-side edge along the X'-axis direction to the +Z"-axis-side edge along the +X'-axis-side edge, and then connected to the connection electrode 28.

In the embodiment, alternatively, the extraction electrodes straddling the stepped portion may have a small width, although it is obvious.

The connection electrode 28 is electrically connected to the excitation electrode 24 by extending the extraction electrode 26 from the lower surface of the quartz crystal substrate 12 to the upper surface of the substrate via a side surface thereof. Thereby, on one of the surfaces (for example, on the upper surface) of the substrate 12 are provided the two connection electrodes 22 and 28. Accordingly, when the quartz crystal resonator element 10 is mounted on a substrate or in a package, top-coating with a conductive adhesive is not needed. This can prevent an excessively applied conductive adhesive from contacting with a side surface of the metal package, another electrode, or the like and causing a short circuit. Additionally, since a bump or the like may be used to mount the quartz crystal resonator element 10, options for mounting the resonator element can be increased.

Figure 3:
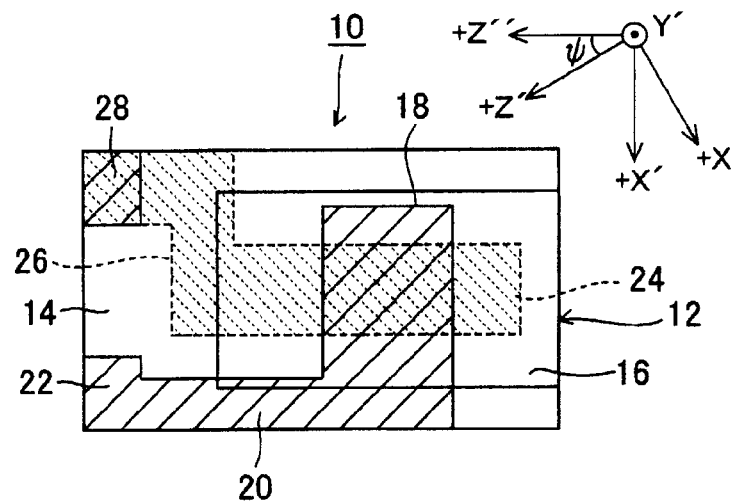
FIG. 3 is a diagram showing a second electrode pattern used in the quartz crystal resonator element according to the first embodiment.

Next, a second electrode pattern will be described with reference to FIG. 3. The second electrode pattern is formed by inversely providing the electrode patterns on the upper and the lower surfaces of the quartz crystal substrate 12 with respect to the first electrode pattern described above. Thus, the same reference numerals are given to portions having the same functions as those in the first electrode pattern and thus descriptions thereof will be omitted.

Figure 4:
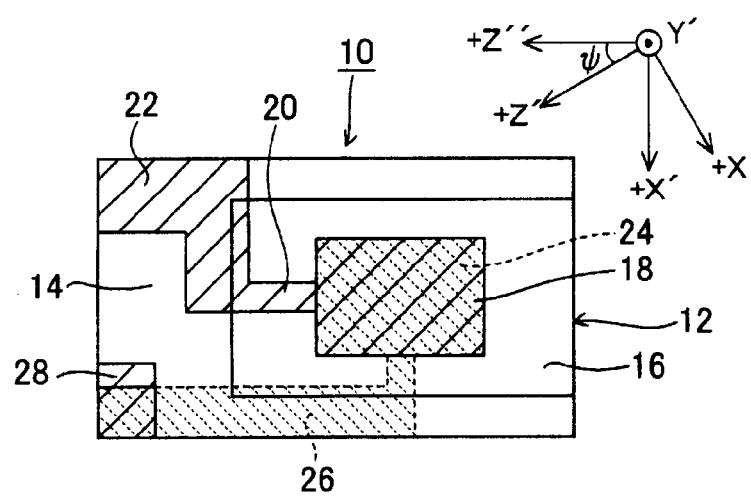
FIG. 4 is a diagram showing a third electrode pattern used in the quartz crystal resonator element according to the first embodiment.

Next will be described a third electrode pattern by referring to FIG. 4. In the third electrode pattern, the excitation electrodes 18 and 24 provided respectively on the upper and the lower surfaces of the resonating section 16 have the same shape and the same size, and are arranged such that there is no deviation between the electrodes 18 and 24. Positions of the connection electrodes 22 and 28 arranged are the same as those in the first and the second electrode patterns. The extraction electrodes 20 and 26 are formed as follows. The extraction electrode 20 connecting the excitation electrode 18 to the connection electrode 22 on the upper surface is extended up to the stepped portion between the thin resonating section 16 and the thick section 14 along the axis Z" and then arranged up to the −X'-axis side in the manner straddling the stepped portion. Thereby, a portion of the electrode 20 straddling the stepped portion has a large width. Then, the extraction electrode 20 is connected to the connection electrode 22 along the −X'-axis-side edge. On the other hand, the extraction electrode 26 connecting the excitation electrode 24 on the lower surface to the connection electrode 28 on the upper surface is extended up to the +X'-axis-side edge and then extended to the +Z"-axis-side edge along the +X'-axis-side edge so as to be connected to the connection electrode 28 provided on the upper surface of the quartz crystal substrate 12 via the side surface thereof.

Figure 5:
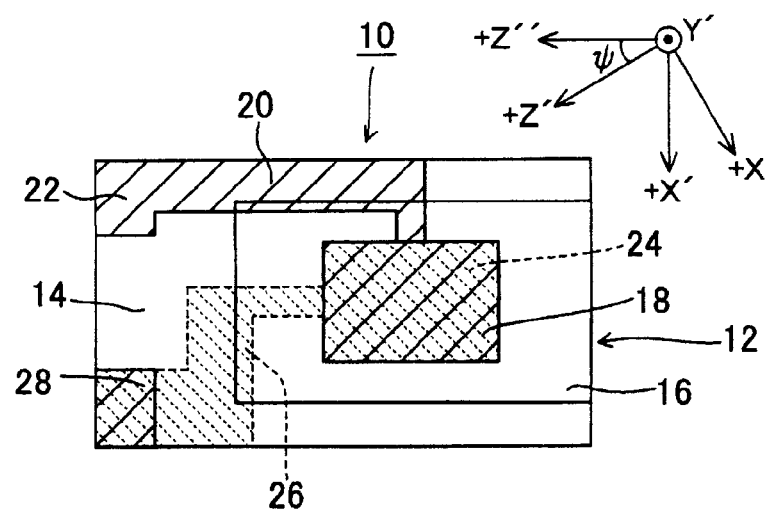
FIG. 5 is a diagram showing a fourth electrode pattern used in the quartz crystal resonator element according to the first embodiment.

Next, a fourth electrode pattern will be described with reference to FIG. 5. The fourth electrode pattern is formed by inverting the electrode patterns on the upper and the lower surfaces of the quartz crystal substrate 12 with respect to the third electrode pattern. Thus, the same reference numerals are given to portions having the same functions as those in the third electrode pattern and thus descriptions thereof will be omitted.

Figure 6:
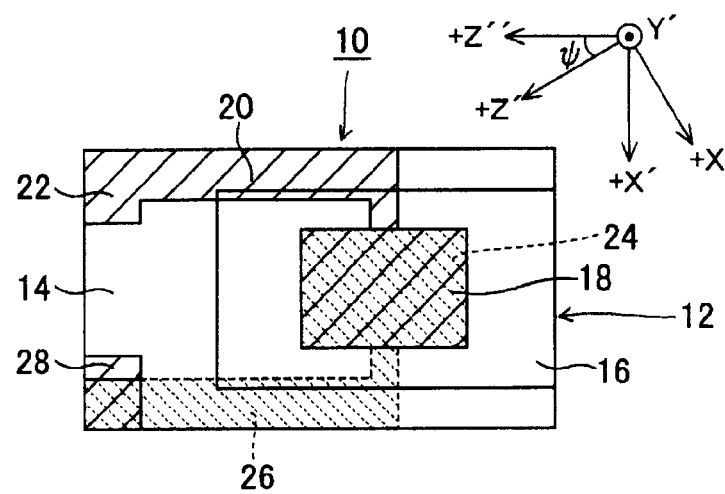
FIG. 6 is a diagram showing a fifth electrode pattern used in the quartz crystal resonator element according to the first embodiment.

Next will be described a fifth electrode pattern by referring to FIG. 6. The fifth electrode pattern is different from the third and the fourth electrode patterns in terms of an arrangement manner of the extraction electrodes 20 and 26. Specifically, the extraction electrode 20 on the upper surface is extended from the excitation electrode 18 to the −X'-axis-side edge and then extended up to the +Z"-axis-side edge along the −X'-axis-side edge. In contrast, the extraction electrode 26 on the lower surface is extended from the excitation electrode 24 up to the +X'-axis-side edge and then extended up to the +Z"-axis-side edge along the +X'-axis-side edge. In short, the fifth electrode pattern is formed to be symmetrical between the upper and the lower surfaces of the quartz crystal substrate 12.

Figure 7:
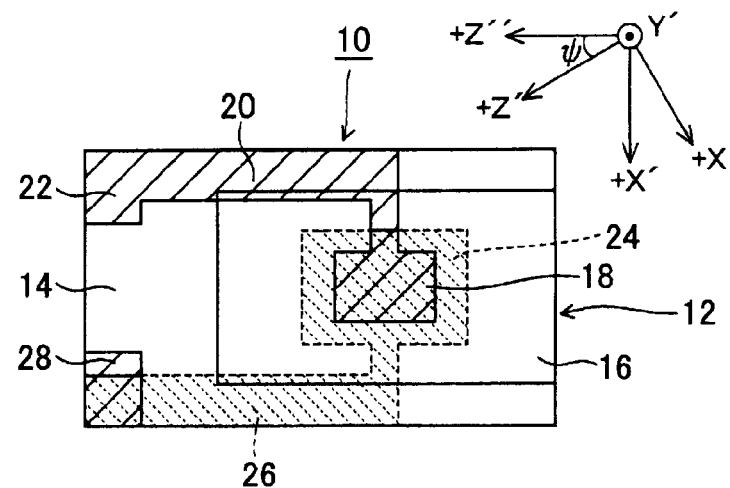
FIG. 7 is a diagram showing a sixth electrode pattern used in the quartz crystal resonator element according to the first embodiment.

Next, a sixth electrode pattern will be described with reference to FIG. 7. The sixth electrode pattern is made similar to the fifth electrode pattern, excepting that a size of the excitation electrode 18 on the upper surface is made smaller than that of the excitation electrode 24 on the lower surface in the sixth electrode pattern. Thereby, the resonating section 16 contributing to excitation maintains a same size, even if any deviation occurs between the upper-surface excitation electrode 18 and the lower-surface excitation electrode 24. This can reduce differences in the oscillation characteristics in the mass production of the quartz crystal resonator element 10.

Figure 8:
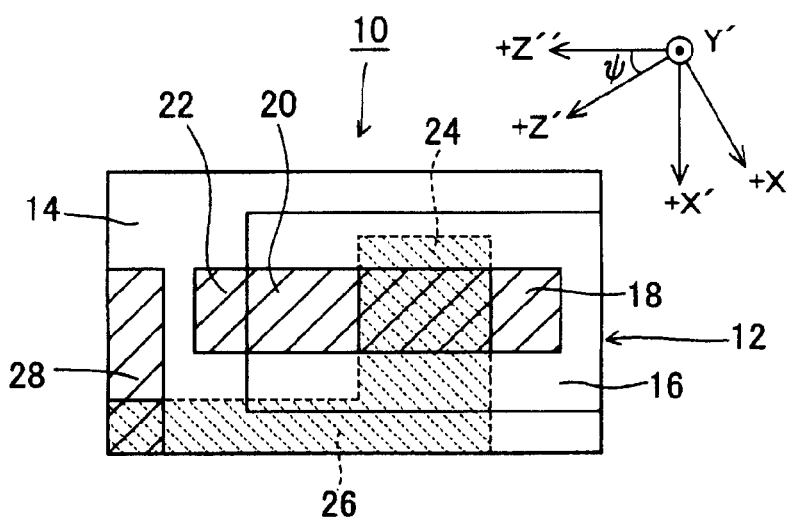
FIG. 8 is a diagram showing a seventh electrode pattern used in the quartz crystal resonator element according to the first embodiment.

Next, a seventh electrode pattern will be described with reference to FIG. 8. The seventh electrode pattern is similar to the first electrode pattern, excepting that the connection electrodes 22 and 28 on the thick section 14 are arranged in a direction along the Z" axis in the seventh electrode pattern. Thereby, the excitation electrode 18 and the connection electrode 22, and the extraction electrode 20 provided on the upper surface are arranged in a straight line along the Z" axis. Meanwhile, the excitation electrode 24 and the extraction electrode 26 on the lower surface are arranged in the same manner as in the first electrode pattern. However, the extraction electrode 26, which is extended to the upper surface via the side surface of the quartz crystal substrate 12, is connected to the connection electrode 28 arranged in a different manner. Specifically, the connection electrode 28 electrically connected to the excitation electrode 24 on the lower surface is arranged so as to be positioned on an extension of the connection electrode 22, the extraction electrode 20, and the excitation electrode 18 on the upper surface, and connected to the extraction electrode 26 extended up to the upper surface. In this case, there can be obtained a particularly advantageous effect when the direction of the Z" axis is the same as a direction in which the X axis is rotated by +60° about the Y' axis under a condition where an angle rotating the +X axis in a −Z'-axis direction about the Y axis as a reference point is a positive rotation angle. The direction in which the X axis is rotated by +60° about the Y' axis, (namely, a direction in which the Z' axis is rotated by −30° about the Y' axis) is a direction in which oscillation characteristics of quartz crystal is hardly influenced by stress of any external force. In short, the above direction shows a lowest stress sensitivity. Thus, providing the connection electrodes 22 and 28 along the direction can suppress influence of stress imposed to the substrate 12 through a support portion.

Figure 9:
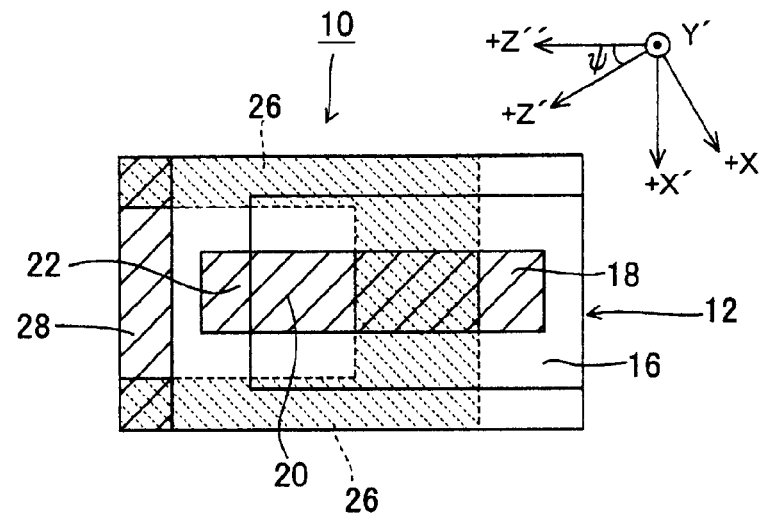
FIG. 9 is a diagram showing an eighth electrode pattern used in the quartz crystal resonator element according to the first embodiment.

Next, an eighth electrode pattern will be described with reference to FIG. 9. The eighth electrode pattern is similar to the seventh electrode pattern, excepting that, in the electrode patterns provided on the lower surface, the extraction electrode 26 is arranged axisymmetrically with respect to a length-direction center line (not shown). Arranging the extraction electrode 26 as above can reduce the risk of disconnection in extension of the electrode 26 up to the upper surface.

Figure 10:
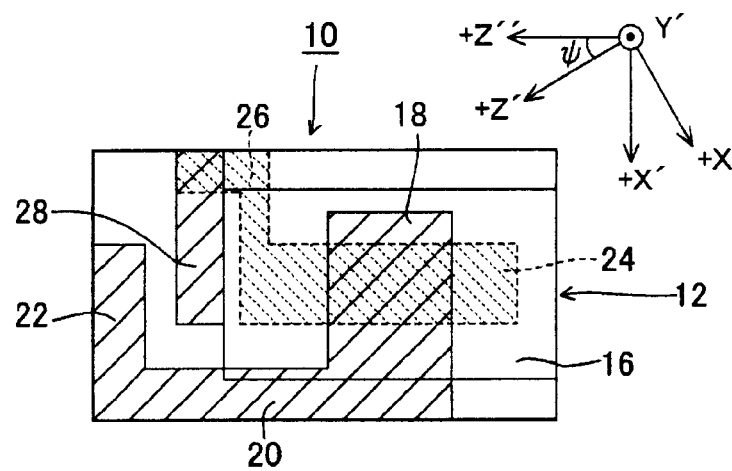
FIG. 10 is a diagram showing a ninth electrode pattern used in the quartz crystal resonator element according to the first embodiment.

Next, a ninth electrode pattern will be described with reference to FIG. 10. The ninth electrode pattern also resembles to the seventh electrode pattern described above, excepting that directions of the excitation electrodes 18 and 24 respectively arranged on the upper and the lower surfaces of the quartz crystal substrate 12 are inverted with respect to each other (the lower-surface excitation electrode 24 is arranged along the Z" axis and the upper-surface excitation electrode 18 is arranged to intersect with the electrode 24), as well as excepting that the lower-surface extraction electrode 26 is extended in a zigzag shape. Extending the extraction electrode 26 in the shape as shown in FIG. 10 can prevent an increase in overlapping portions of the electrode patterns on the upper and the lower surfaces.

Figure 11:
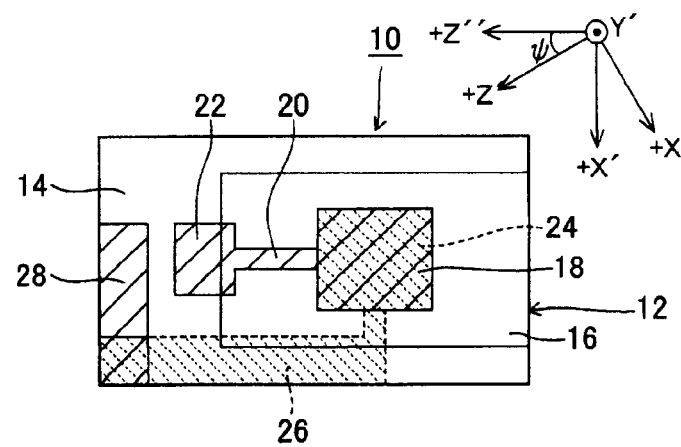
FIG. 11 is a diagram showing a tenth electrode pattern used in the quartz crystal resonator element according to the first embodiment.

Next, a tenth electrode pattern will be described with reference to FIG. 11. The tenth electrode pattern is formed like a combination of the third to the fifth electrode patterns and the seventh electrode pattern. Specifically, the excitation electrode 18 on the upper surface and the excitation electrode 24 on the lower surface of the resonating section 16 have the same shape and are arranged at the same position. Additionally, the connection electrodes 22 and 28 are positioned on a straight line parallel to the Z" axis. Additionally, line widths of the extraction electrodes 20 and 26 positioned near the excitation electrodes 18 and 24 are made small to reduce capacitance changes occurring due to deviation between the excitation electrodes 18 and 24 on the upper and the lower surfaces of the resonating section 16. Other structures regarding the extraction electrodes 20 and 26 are the same as those in the above-described seventh electrode pattern.

Figure 12:
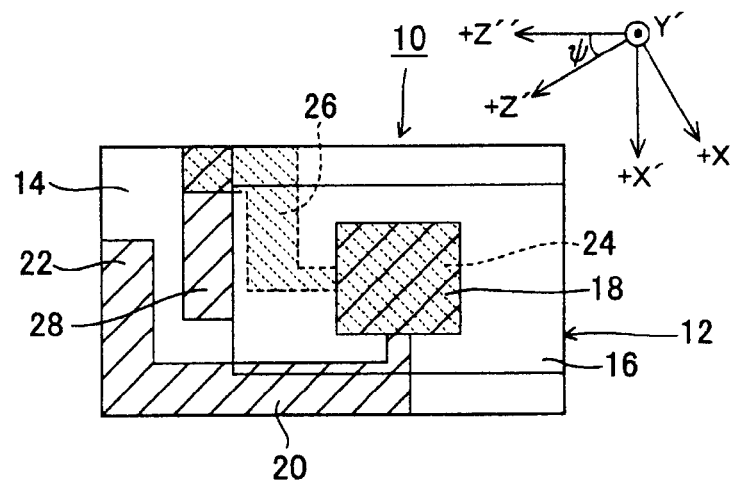
FIG. 12 is a diagram showing an eleventh electrode pattern used in the quartz crystal resonator element according to the first embodiment.

Next, an eleventh electrode pattern will be described with reference to FIG. 12. The eleventh electrode pattern is formed by using the extraction electrodes 20 and 26 of the ninth electrode pattern in the tenth electrode pattern described above.

Figure 13:
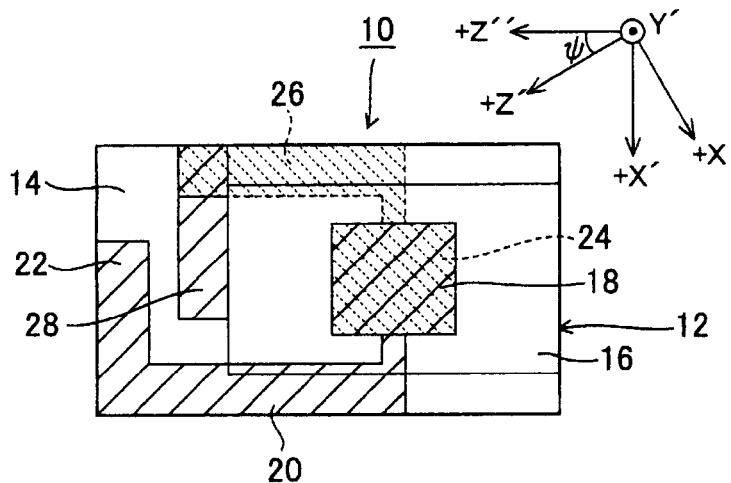
FIG. 13 is a diagram showing a twelfth electrode pattern used in the quartz crystal resonator element according to the first embodiment.

Next, a twelfth electrode pattern will be described with reference to FIG. 13. The twelfth electrode pattern resembles to the eleventh electrode pattern described above, excepting that the extraction electrodes 20 and 26 arranged on the upper and the lower surfaces of the resonating section 16 are symmetrical with respect to each other, where the twelfth pattern is similar to the fifth and the sixth electrode patterns described above.

Figure 14:
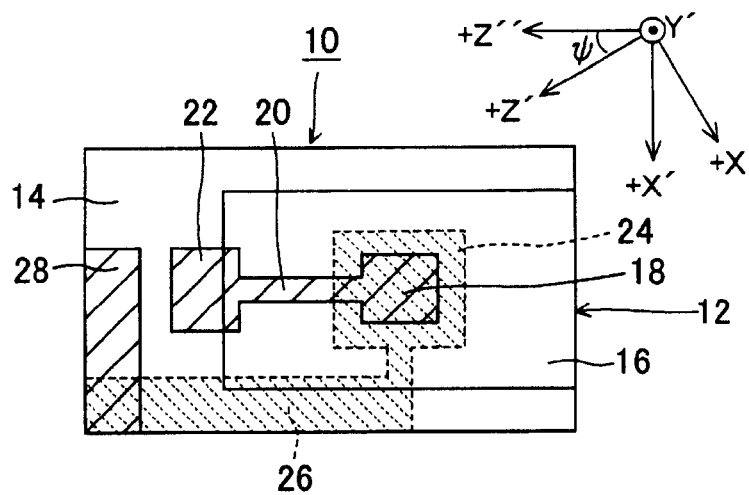
FIG. 14 is a diagram showing a thirteenth electrode pattern used in the quartz crystal resonator element according to the first embodiment.

Next, a thirteenth electrode pattern will be described with reference to FIG. 14. The thirteenth electrode pattern is formed by using the excitation electrodes 18 and 24 of the sixth electrode pattern in the tenth electrode pattern described above.

Figure 15:
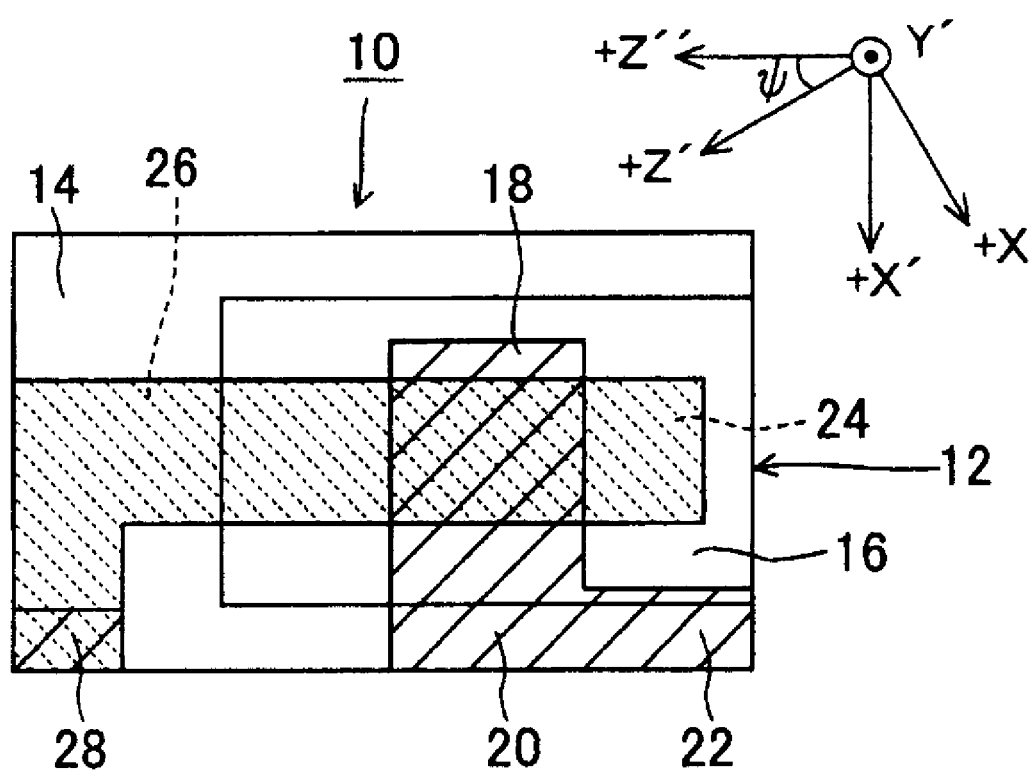
FIG. 15 is a diagram showing another electrode pattern that can be used in the quartz crystal resonator element according to the first embodiment.
Figure 16A:
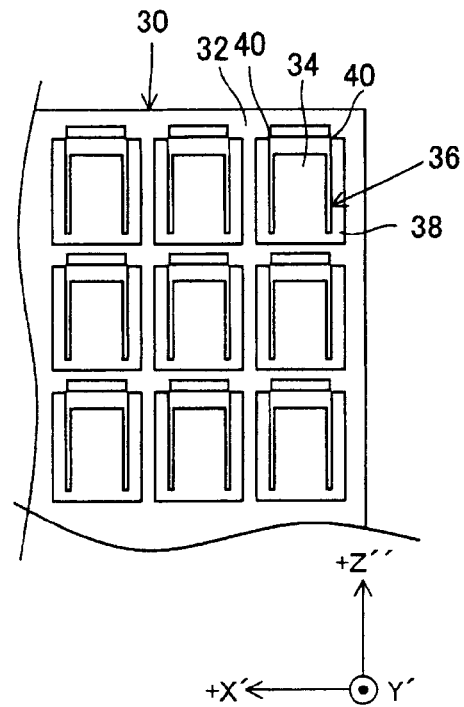
FIGS. 16A to 16D are diagrams illustrating steps involved in a method for producing the quartz crystal resonator element according to a first embodiment of the invention.
Figure 16B:
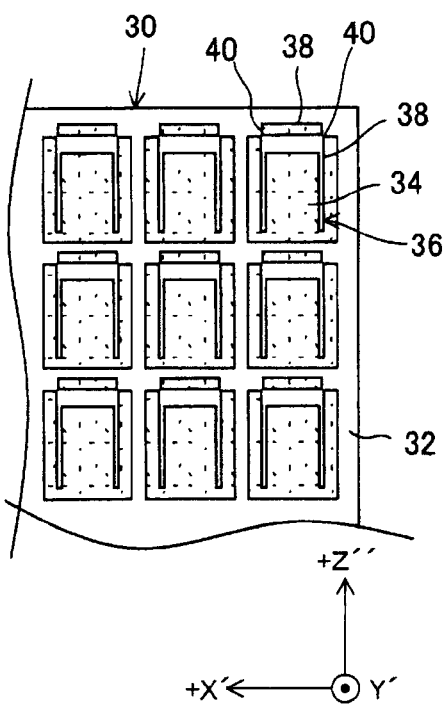
Figure 16C:
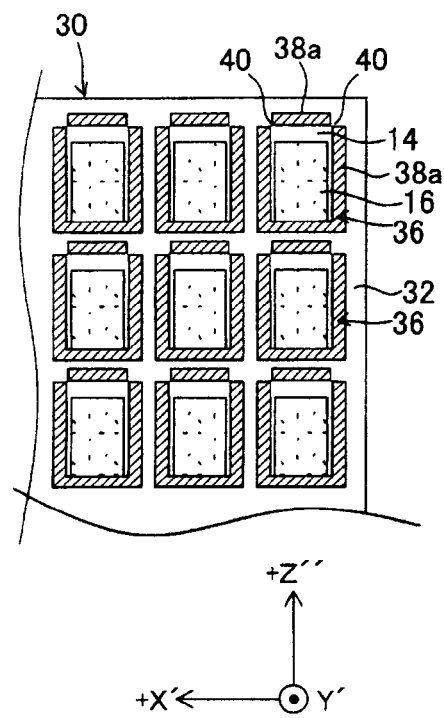
Figure 16D:
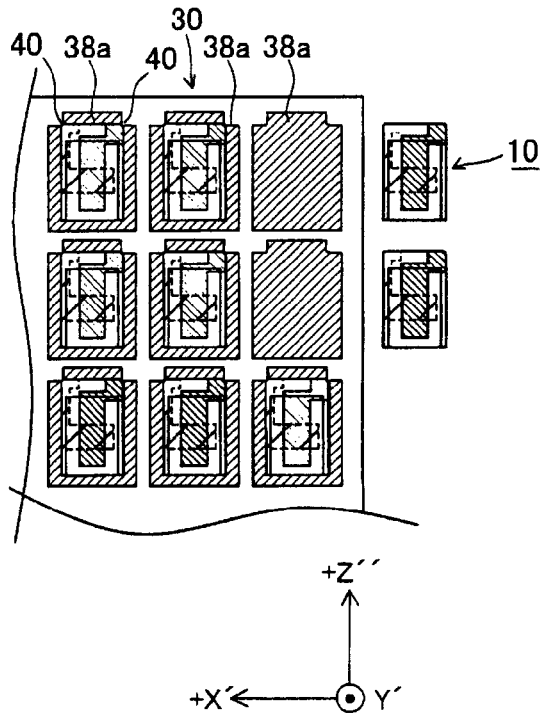
Figure 20A:
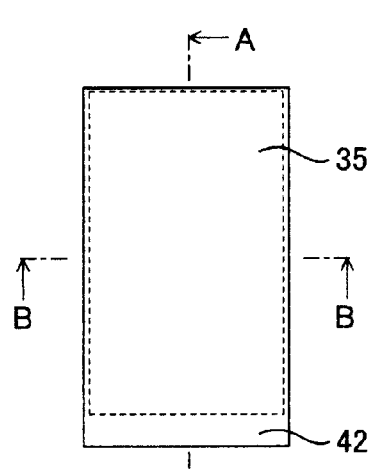
FIGS. 20A to 20C are a plan view and sectional views of an individual-element-forming region upon completion of a first etching process in the production method according to the second embodiment.
Figure 20B:
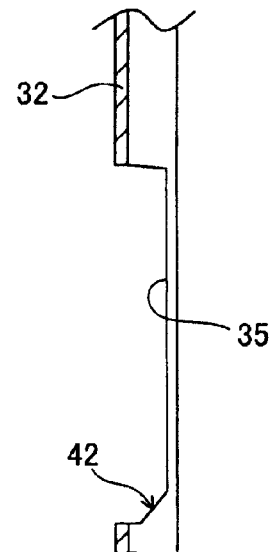
Figure 20C:
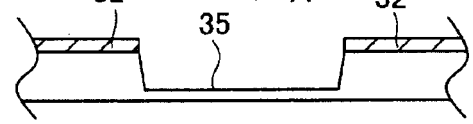
Figure 21A:
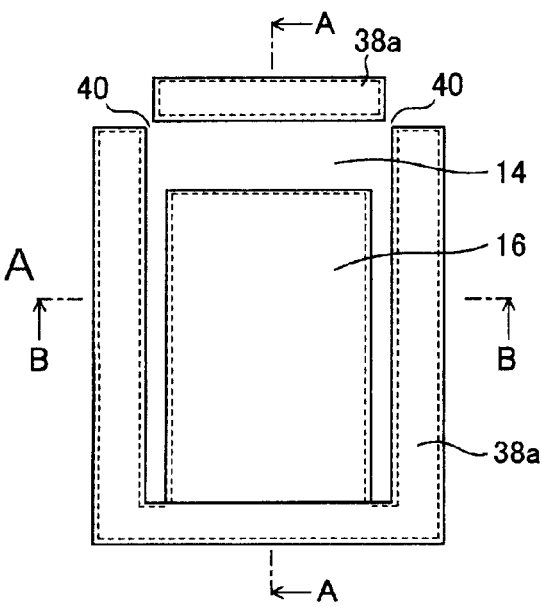
FIGS. 21A to 21C are a plan view and sectional views of the individual-element-forming region upon completion of a second etching process in the production method according to the second embodiment.
Figure 21B:
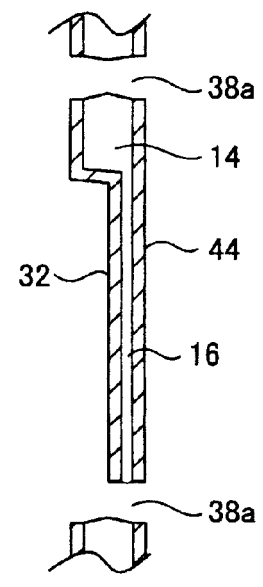
Figure 21C:
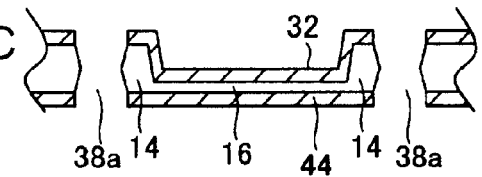

In the descriptions of the electrode patterns hereinabove, the drawings show the excitation electrodes formed in the rectangular shape. However, for example, the third to the sixth electrode patterns and the tenth to the thirteenth electrode patterns may be formed in a circular or oval shape, or another polygonal shape, other than the rectangular shape. Additionally, in illustrations of the electrode patterns, the two connection electrodes 22 and 28 are arranged on the thick section 14 provided on the +Z"-axis side. However, the connection electrodes 22 and 28 may be arranged on the thick section 14 formed along the axis Z" (at a ±X'-axis-side edge), in the direction along the Z" axis, as shown in FIG. 15.

Next will be described in detail a method for producing the quartz crystal resonator element structured as above by referring to drawings.

First, a method for producing the quartz crystal resonator element according to a first embodiment of the invention will be described with reference to FIGS. 16A to 16D. In the first embodiment, the quartz crystal resonator element 10 as each piece is produced from a wafer 30 through a batch processing. First, a mask 32 is formed on a surface of the wafer 30. The mask 32 may be made of a resist or the like. In the present embodiment, the mask 32 is formed to protect the thick section of each substrate, namely, a region except for a resonating-section-forming region (a thin-section-forming region) 34 and an outer peripheral portion of an individual-element-forming region 36 such as a penetrating-groove-forming region 38 including an outer peripheral portion of the non-thick-section-forming region that is an −Z"-axis-side end of the resonating-section-forming region 34. In the production method according to the embodiment, formation of the electrode pattern for each resonator element is also performed on the wafer 30. Accordingly, the mask 32 is formed to also protect a break-off portion 40 keeping each quartz crystal resonator element 10 connected to the wafer 30 (See FIG. 16A). In that case, a method for the etching is not restricted to any specific one. For example, an upper surface of the wafer 30 may be surrounded with a frame to pour an etching liquid into the frame, or the wafer 30 may be immersed in the etching liquid after a lower surface and side surfaces of the wafer 30 are covered with a resist or the like.

Next, except for the above mask-forming region, the resonating-section-forming region 34 and the penetrating-groove-forming region 38 are wet-etched to form a plurality of recessed portions on the upper surface of the wafer 30 (a first etching process). In the present embodiment, the first etching process is performed on a +Y'-axis-side upper surface (See FIG. 16B). The individual-element-forming region 36 included in each quartz crystal substrate 12 obtained by etching under the condition has sectional shapes as shown in FIGS. 17B and 17C due to an anisotropic crystalline structure. In FIGS. 17A to 17C, FIG. 17A is a plan view of the individual-element-forming region; FIG. 17B is a sectional view taken along line A-A of FIG. 17A; and FIG. 17C is a sectional view taken along line B-B of FIG. 17A. As seen from a comparison between FIGS. 17A and 17B, in the production method of the present embodiment, residues (an inclined portion) 42 appearing on the −Z"-axis side are positioned on the −Z"-axis side (on an extremity side) farther than ends of the thick section 14.

Next, the mask is once separated to form a mask 44 on the lower surface side of the wafer 30. It is only necessary for the mask 44 to have respective openings each formed only with the penetrating-groove-forming region 38 including the outer peripheral portion of the thick-section-forming region and the outer peripheral portion of the non-thick-section-forming region. Wet etching is performed on the wafer 30 having the new mask 44 (32) formed thereon to form each penetrating groove 38*a* (a second etching process). FIGS. 18B and 18C show sectional shapes of the penetrating groove 38*a* formed by the wet etching. In FIGS. 18A to 18C, FIG. 18A is a plan view of the individual-element-forming region 36; FIG. 18B is a sectional view taken along line A-A of FIG. 18A; and FIG. 18C is a sectional view taken along line B-B of FIG. 18A. As also seen from FIG. 18B, performing wet etching on a lower surface of the wafer 30 to form the penetrating groove 38*a* allows protrusion of an end portion adjacent to the thick section 14 (the +Z"-axis-side end) to be inhibited. Additionally, upon formation of the penetrating-groove-forming region 38, an etching liquid is likely to flow onto the resonating section 16, thereby promoting etching. Accordingly, desirably, the mask 32 is formed also on the upper-surface side of the wafer 30 (See FIG. 16C).

After forming the outline configuration of the quartz crystal substrate 12 in the above manner, the electrode patterns are formed. To form the electrode patterns, there may be used an ordinary method such as forming a mask by vapor deposition using a masking jig or photolithography after forming a metal film by vapor deposition or sputtering, and then etching unnecessary parts. The extraction electrode 26 arranged on the lower surface (See FIG. 1, for example) is connected to the extraction electrode 26 or the connection electrode 28 arranged on the upper surface (See FIG. 1, for example) via at least one side surface of the quartz crystal substrate 12 where the penetrating groove 38*a* is formed.

The quartz crystal resonator element 10 as each piece is cut off from the wafer 30 having the electrode patterns formed thereon to complete the quartz crystal resonator element 10 as an individual product. To obtain each piece, the resonator element 10 is separated by breaking off at the break-off portion 40 (See FIG. 16D)

Next, a method for producing the quartz crystal resonator element according to a second embodiment will be described with reference to FIGS. 19A to 19C. The method of the second embodiment is different from that of the first embodiment in terms of changing etching ranges of the first and the second etching processes.

Specifically, in the first etching process, the mask 32 is formed to cover portions except for a region (referred to as a "first etching region 35") including a region for forming the resonating section 16 (the thin-section-forming region) and a −Z"-axis-side region that will have the etching residues 42 (the outer peripheral portion of the non-thick-section-forming region), so as to form the thin section for the resonating section 16. The first etching process is performed only on the upper surface of the substrate 12 (See FIGS. 19A and 19B).

Next, the mask 32 is once removed, and then, the second etching process is performed. The second etching process forms the mask 32 to cover a region except for the penetrating-groove-forming regions including the outer peripheral portions of the thick-section-forming regions and the outer peripheral portions of the non-thick-section-forming regions, namely to cover the individual-element-forming region 36 included in each quartz crystal substrate 12 and the break-off portion 40. In addition, in the second embodiment, the masks 32 and 44 (See FIGS. 21A to 21C), respectively, are formed on the upper and the lower surfaces, respectively. The mask 44 on the lower surface is, as in the mask 32 on the upper surface, formed to cover portions except for the penetrating-groove-forming regions.

Wet etching is performed on both of the upper and the lower surfaces of the wafer 30 having the masks 32 and 44 formed as above. The etching for forming the penetrating groove 38*a* is simultaneously performed on the upper and the lower surfaces, whereby an end shape of the quartz crystal substrate 12 is beautifully finished (See FIG. 19C).

Then, the electrode patterns are formed on the wafer 30 with the quartz crystal substrates 12 having the outline configuration formed as above. After forming the electrode patterns thereon, the resonator element 10 is individually cut off from the wafer 30 to complete the resonator element 10 as an individual product.

In the quartz crystal resonator element 10 thus structured, adjustment of the in-plane rotation angle allows a region having a large amount of the residues 42 generated by wet etching to be restricted only on the −Z"-axis side. Then, etching the thick section of the −Z"-axis side with the large amount of the residues 42 can increase an area of the resonating section 16 on the quartz crystal substrate 12. Furthermore, increasing the area of the resonating section 16 allows the excitation electrodes 18 and 24 to be made large relative to the size of the quartz crystal resonator element 10. This can create an energy confinement effect, thereby preventing a dip in a graph of temperature characteristics.

When a main surface for performing wet etching to form the thin resonating section 16 is reversed, namely, switched to a −Y'-axis side, respective plus and minus (±) directions for the Z" axis and the X' axis are also reversed.

Figure 22:
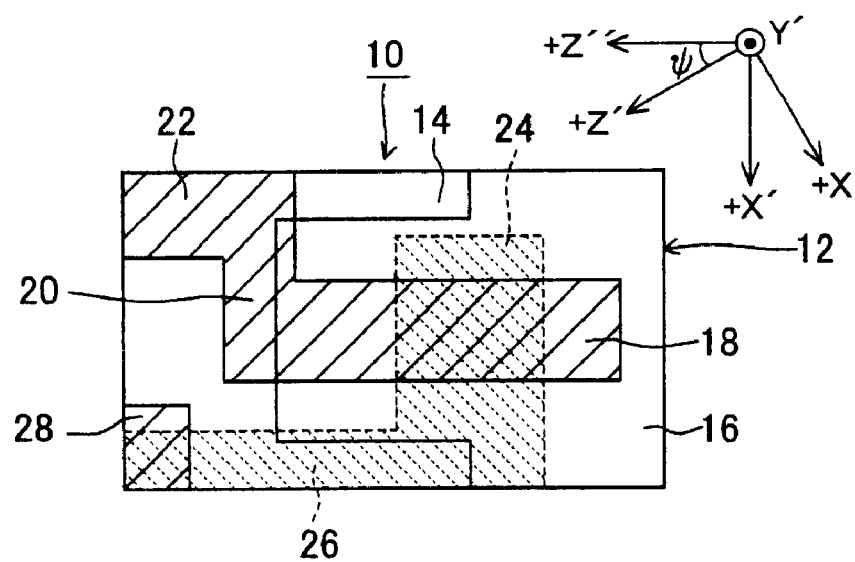
FIG. 22 is a diagram showing a modified example of the quartz crystal resonator element according to the first embodiment.

Next will be described a modification of the quartz crystal resonator element according to the first embodiment by referring to FIG. 22. The resonator element 10 of the modification has almost the same structure as that of the resonator element 10 of the first embodiment described above, excepting that the thick section 14 surrounds the thin resonating section 16 in an approximately U-letter shape along edges other than the −Z"-axis-side edge.

The thick section 14 extended up to a free-end side (the −Z"-axis side) in the first embodiment is formed up to a predetermined midway position of a periphery of the resonating section 16 in the modification, where a thin section integrated with the resonating section 16 is provided at a top end of the thick section 14 (on the −Z"-axis side).

When the quartz crystal resonator element 10 has a sufficient mechanical strength, the resonator element 10 may be structured as above and can be regarded as a modified example of the first embodiment.

Figure 23:
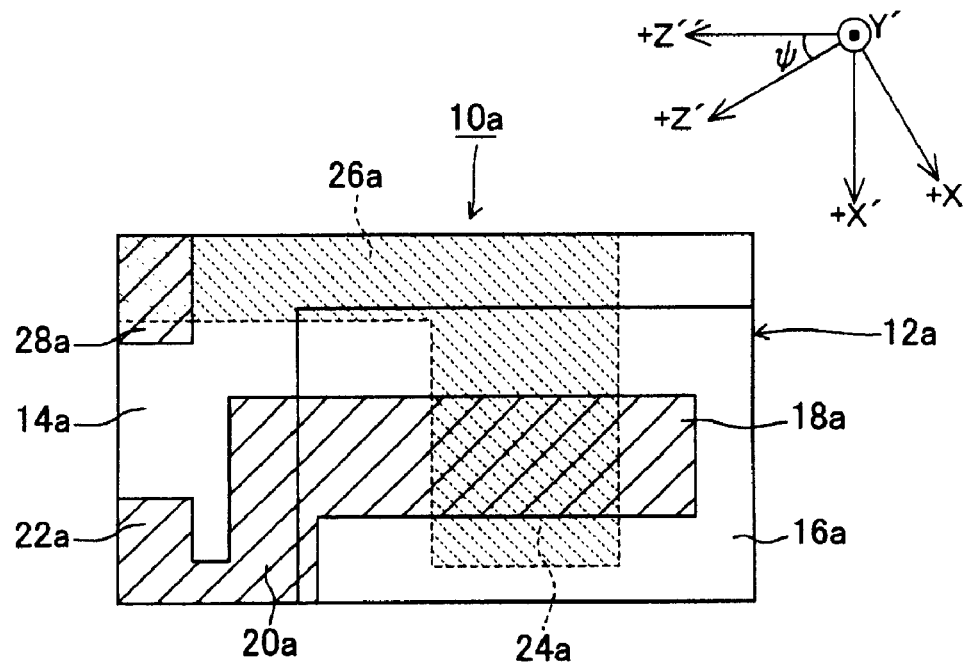
FIG. 23 is a diagram showing a structure of a quartz crystal resonator element according to a second embodiment of the invention.

Next, a description will be given of a quartz crystal resonator element according to a second embodiment of the invention by referring to FIG. 23. The resonator element 10*a* of the second embodiment is particularly effective when a surface for forming the thin section is on the +Y'-axis side and an in-plane rotation angle (a rotation angle of the Z" axis about the Y' axis as the reference point) $\phi$ is expressed by an inequality: $0° \geq \phi \geq -35°$. The quartz crystal resonator element of the second embodiment has a structure similar to that of the quartz crystal resonator element of the first embodiment. Accordingly, portions having the same functions as in the first embodiment are indicated by reference numerals with a suffix "a" added in the drawing, and descriptions thereof will be omitted.

As described above, in the AT-cut quartz crystal substrate, changing the in-plane rotation angle causes differences in residues generated at the stepped portion between the thin resonating section and the thick section. With the rotation angle in the above range, a large amount of the residues appear on the +X'-axis side and the −Z"-axis side of the resonating section. Thus, in the quartz crystal resonator element 10a according to the second embodiment, the thick section positioned at the edges of the +X'-axis side and the −Z"-axis side is determined as an etching range, thereby increasing an occupancy ratio of the thin section forming a resonating section 16a.

Next will be described structures of electrode patterns for the crystal resonator element according to the second embodiment. First, a first electrode pattern will be described. The first electrode pattern has a structure in which an excitation electrode 18a on an upper surface of a resonating section 16a is arranged along the Z" axis, and an excitation electrode 24a on a lower surface of the section 16a is arranged so as to intersect with the excitation electrode 18a. Connection electrodes 22a and 28a are arranged on the +Z"-axial-side end to connect the excitation electrodes 18a, 24a to the connection electrodes 22a, 28a by extraction electrodes 20a, 26a. The extraction electrode 20a connected to the excitation electrode 18a arranged on the upper surface is extended up to a thick section 14a along the Z" axis, and then extended up to the edge of the +X'-axis side in the manner straddling the stepped portion. The structure as above increases a width of an electrode film straddling the stepped portion, thereby minimizing the risk of disconnection of the electrode film at the stepped portion. The extraction electrode 20a arranged up to the +X'-axis-side edge is extended up to the connection electrode 22a along the +X'-axis-side edge.

Meanwhile, an extraction electrode 26a connected to the excitation electrode 24a provided on the lower surface is arranged up to the −X'-axis-side edge, then, extended up to a lower-surface side of the connection electrode 28a along the −X'-axis-side edge, and connected to the connection electrode 28a provided on the upper surface of the quartz crystal substrate 12a via a side surface of the substrate.

Figure 24:
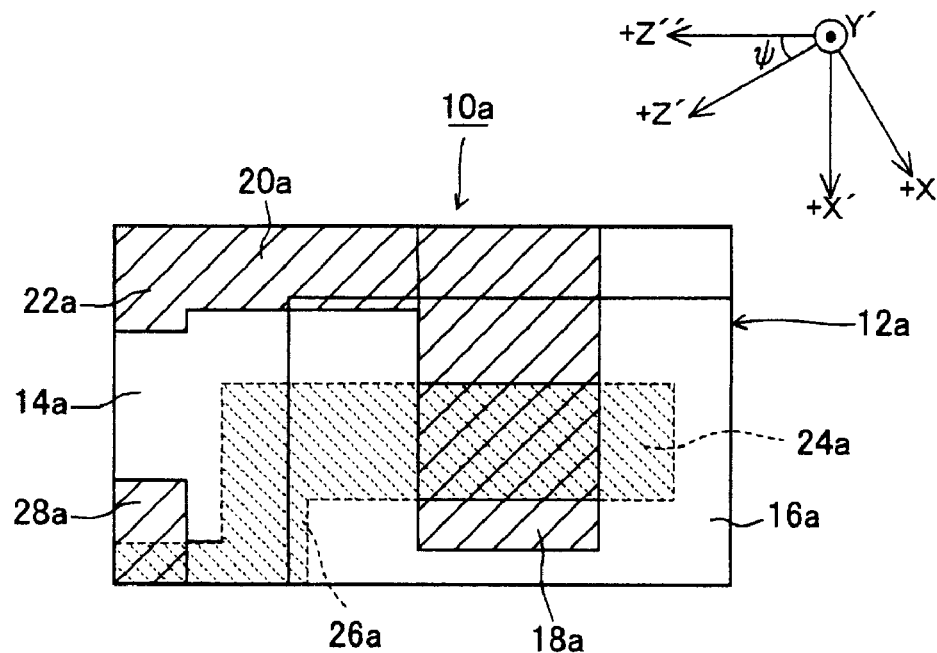
FIG. 24 is a diagram showing a second electrode pattern used in the quartz crystal resonator element according to the second embodiment.

Next, a second electrode pattern will be described with reference to FIG. 24. The second electrode pattern is different from the first electrode pattern in that structures of the electrodes arranged on the upper and the lower surfaces of the quartz crystal substrate 12a are reversed. Accordingly, the extraction electrode 20a on the upper surface is arranged between the thick section 14a and the thin resonating section 16a in a manner straddling the stepped portion positioned on the −X'-axis side.

A method for producing the quartz crystal resonator element 10a thus structured is almost the same as the method for producing the quartz crystal resonator element 10 of the first embodiment, and thus the same description as above will be applied. Additionally, the methods of the first and the second embodiments are different in that the thick section positioned in the +X'-axis-side direction is also removed by wet etching in consideration of residues that may be generated on the +X'-axis side.

As compared to the quartz crystal resonator element 10 of the first embodiment, the quartz crystal resonator element 10a formed as above is more advantageous to secure a space for the resonating section as the in-plane rotation angle φ becomes closer to 0°. Furthermore, the outline configuration of the resonator element can be formed through the batch processing using only wet etching. Thus, the quartz crystal resonator element 10a has a high mass productivity and hardly causes any crack or defect at an end portion thereof, as compared to the quartz crystal resonator element disclosed in JP-A-2002-33640.

Even in the quartz crystal resonator element 10a thus structured, when a main surface for performing wet etching to form the thin resonating section 16 is reversed (when wet etching is performed on the −Y'-axis side, respective plus and minus (±) directions for the Z" axis and the X' axis are reversed.

Figure 25:
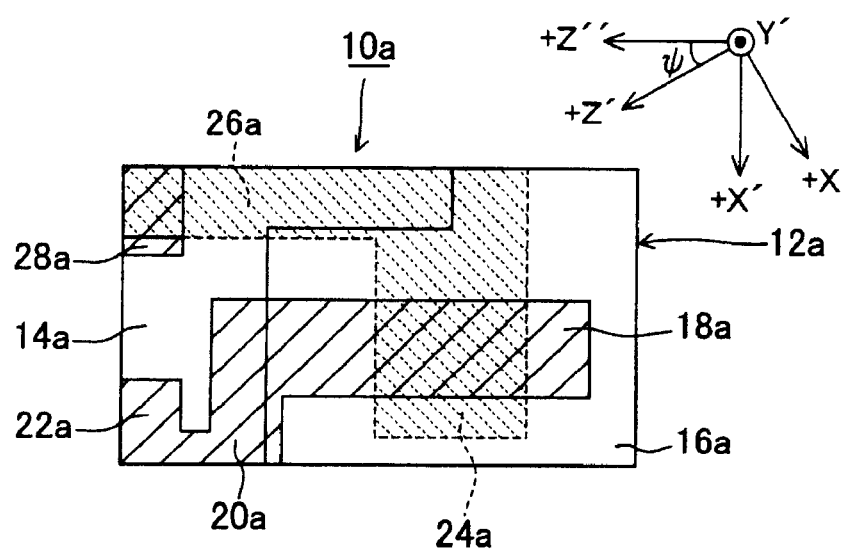
FIG. 25 is a diagram showing a modified example of the quartz crystal resonator element according to the second embodiment.

Next will be described a modification of the quartz crystal resonator element according to the second embodiment by referring to FIG. 25. The quartz crystal resonator element 10a according to the modification is structured in almost the same manner as the resonator element 10a of the second embodiment described above, excepting for a shape of the thick section 14a surrounding the thin resonating section 16a in an L-letter shape. The thick section 14a extended up to a free-end side (a top end of the −Z"-axis) in the second embodiment is arranged up to a predetermined midway position of the resonating section 16a in the present modification, as well as a thin section integrated with the resonating section 16a is provided at a top-end side of the thick section 14a.

The quartz crystal resonator element 10a having sufficient mechanical strength may be structured as above and can be regarded as a modified example of the second embodiment.

Figure 26:
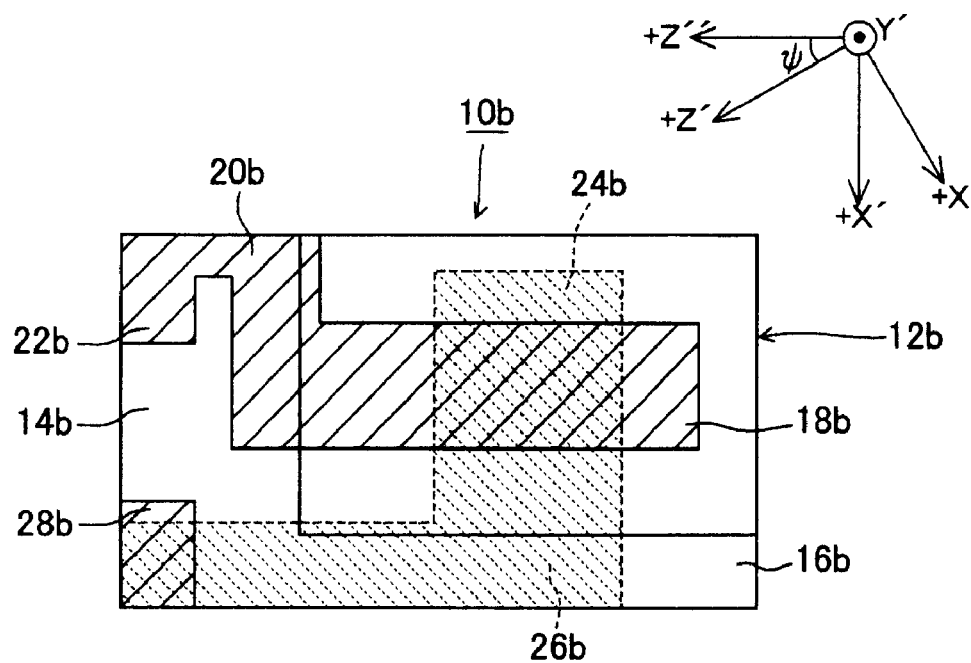
FIG. 26 is a diagram showing a structure of a quartz crystal resonator element according to a third embodiment of the invention.

Next, a description will be given of a quartz crystal resonator element according to a third embodiment of the invention by referring to FIG. 26. The resonator element of the third embodiment is particularly effective when the thin-section-forming region is set on the +Y'-axis side and the in-plane rotation angle (the rotation angle of the Z" axis about the Y' axis as the reference point) φ is expressed by an inequality: $-25° \geq \phi \geq -60°$. A quartz crystal resonator element 10b according to the third embodiment is structured similarly to that of the quartz crystal resonator elements according to the first and the second embodiments. Accordingly, portions having the same functions as in the embodiments are indicated by reference numerals with a suffix "b" added in the drawing, and descriptions thereof will be omitted.

As described above, on the AT-cut quartz crystal substrate, changing the in-plane rotation angle causes a difference concerning residues generated at the stepped portion between the thin resonating section and the thick section. Setting the rotation angle in the above range can increase the probability of generation of the residues on the +X'-axis side and the −Z"-axis side of the resonating section. Accordingly, in the quartz crystal resonator element 10b according to the third embodiment, the thick section that forms the edges of the −X'-axis side and the −Z"-axis side is set as an etching range, thereby increasing a space occupied by the thin section as a resonating section 16b.

An electrode pattern arranged on the quartz crystal resonator element 10b according to the third embodiment thus structured is almost the same as the electrode pattern of the quartz crystal resonator element 10a according to the second embodiment, excepting that there is a difference associated with a change in the arranging position of the thick section 14 formed in the L-letter shape. Specifically, the electrode pattern of the quartz crystal resonator element 10b of the third embodiment is line-symmetrical to that of the quartz crystal resonator element 10a of the second embodiment with respect to a center line parallel to the Z" axis.

A method for producing the quartz crystal resonator element 10b thus structured is also almost the same as the method for producing the quartz crystal resonator element 10 of the first embodiment, and thus the description above will be applied. However, there is a difference between the methods of the embodiments in that the thick section positioned in a direction of the −X'-axis-side is also removed by wet etching in consideration of the residues that may be generated on the −X'-axis side.

The quartz crystal resonator element 10b structured as above is more advantageous to secure an area for the resonating section 16b as the in-plane rotation angle ϕ becomes closer to −30°. Furthermore, the outline configuration of the resonator element can be formed through the batch processing using only wet etching. Thus, the quartz crystal resonator element 10b has a high mass productivity and hardly causes any crack or defect at an end portion of the element, as compared to the quartz crystal resonator element disclosed in JP-A-2002-23640.

Figure 27:
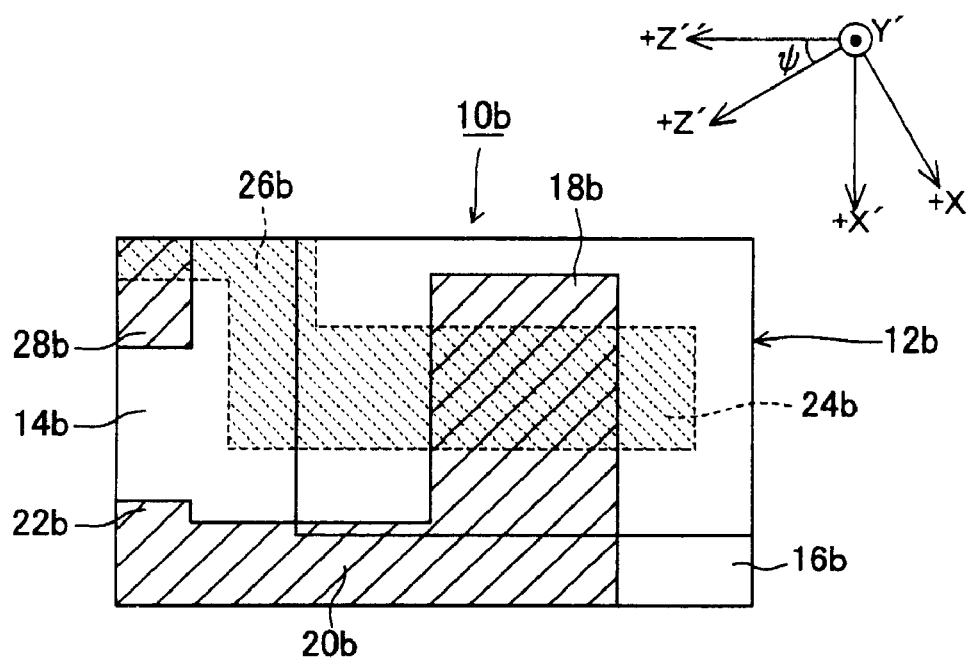
FIG. 27 is a diagram showing an example of an electrode pattern that can be used in the quartz crystal resonator element according to the third embodiment.

When a main surface for performing wet etching to form the thin resonating section 16b is reversed (when wet etching is performed on the −Y'-axis side), respective plus and minus (±) directions for the Z" axis and the X' axis are reversed. Additionally, as in FIG. 27, the quartz crystal resonator element 10b having the electrode pattern reversely arranged can also be regarded as the quartz crystal resonator element 10b according to the third embodiment, although it is obvious.

Figure 28:
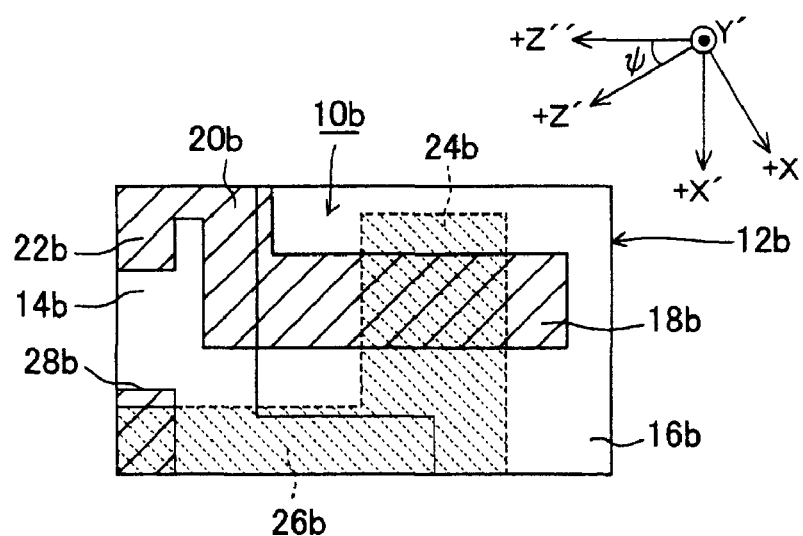
FIG. 28 is a diagram showing a modified example of the quartz crystal resonator element according to the third embodiment.

Next, a modification of the third embodiment will be described with reference to FIG. 28. The quartz crystal resonator element 10b as the modification is structured in almost the same manner as in the resonator element 10b of the third embodiment above, excepting for a shape of the thick section 14b surrounding the thin resonating section 16b in the L-letter shape. The thick section 14b extended up to a free-end side (the −Z"-axis top-end) in the third embodiment is formed up to a predetermined midway position of the resonating section 16b in the present modification, as well as the thin section integrated with the resonating section 16b is provided at a top-end side of the thick section 14b.

The quartz crystal resonator element 10b having a sufficient mechanical strength may be structured as above and can be regarded as a modified example of the third embodiment.

Figure 29:
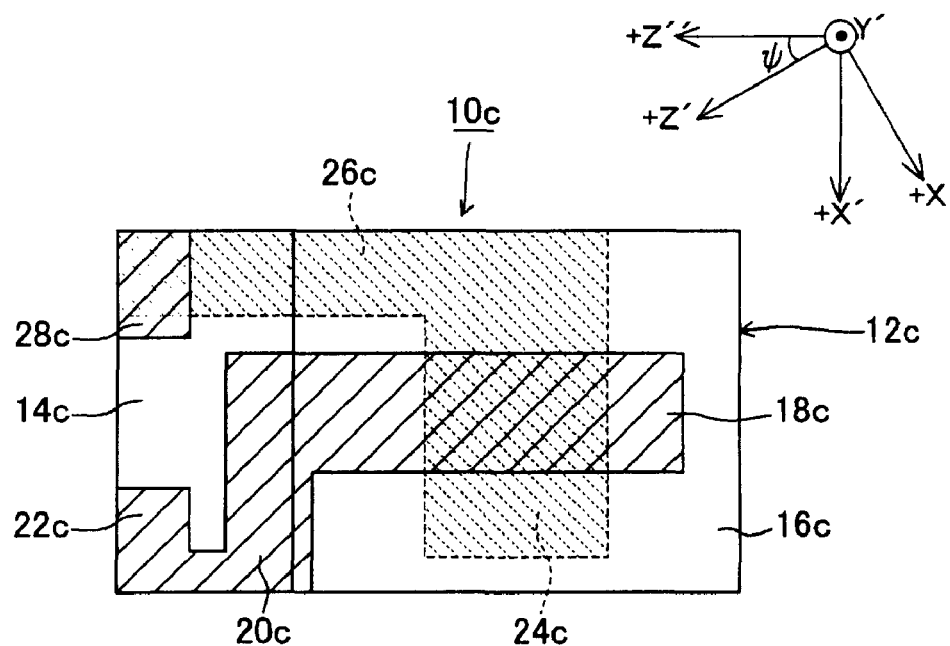
FIG. 29 is a diagram showing a structure of a quartz crystal resonator element according to a fourth embodiment of the invention.

Next, a description will be given of a quartz crystal resonator element according to a fourth embodiment of the invention by referring to FIG. 29. The resonator element of the fourth embodiment is particularly effective when the thin-section-forming region is set on the +Y'-axis side and the in-plane rotation angle (the rotation angle of the Z" axis about the Y' axis as the reference point) ϕ is expressed by an inequality: −120°≧ϕ≧+60°. A quartz crystal resonator element 10c according to the fourth embodiment has a structure similar to that of the quartz crystal resonator element of each of the first to the fourth embodiments. Accordingly, portions having the same functions as in the embodiments are indicated by reference numerals with a suffix "c" added in the drawing, and detailed descriptions thereof will be omitted.

As described in the second and the third embodiments, on the AT-cut quartz crystal substrate, changing the in-plane rotation angle causes a difference concerning residues generated at the stepped portion between the thin section and the thick section. Setting the rotation angle in the above range allows an increased or decreased amount of the residues to appear on the ±X'-axis side and −Z"-axis side of the thin section. Thus, in the quartz crystal resonator element 10c of the fourth embodiment, the thick section forming the ±X'-axis-side edge and the −Z"-axis-side edge (a thick section in each of conventional quartz crystal resonator elements) is set as an etching range, thereby increasing an area for the thin section forming a resonating section 16c.

In the quartz crystal resonator element 10c thus structured, a thick section 14c includes only the +Z"-axis-side edge as a supporting portion, and most of a thick section as a frame portion will be removed. Accordingly, as compared to conventional inverted mesa-type quartz crystal resonator elements having the same size as the resonator element 10c, the above structure significantly increases a space occupied by the resonating section 16c on an entire area of a quartz crystal substrate 12c.

An electrode pattern arranged on the quartz crystal substrate 12c may be the same as the electrode patterns arranged on the resonator elements 10 to 10b in the first to the third embodiments described above, and thus, a detailed description thereof will be omitted.

The quartz crystal resonator element 10c structured as above can prevent a size of the resonating section 16c from being reduced due to residues in a broad range, thereby increasing a percentage of an area of the resonating section 16c while maintaining the strength of a supporting member.

Figure 30:
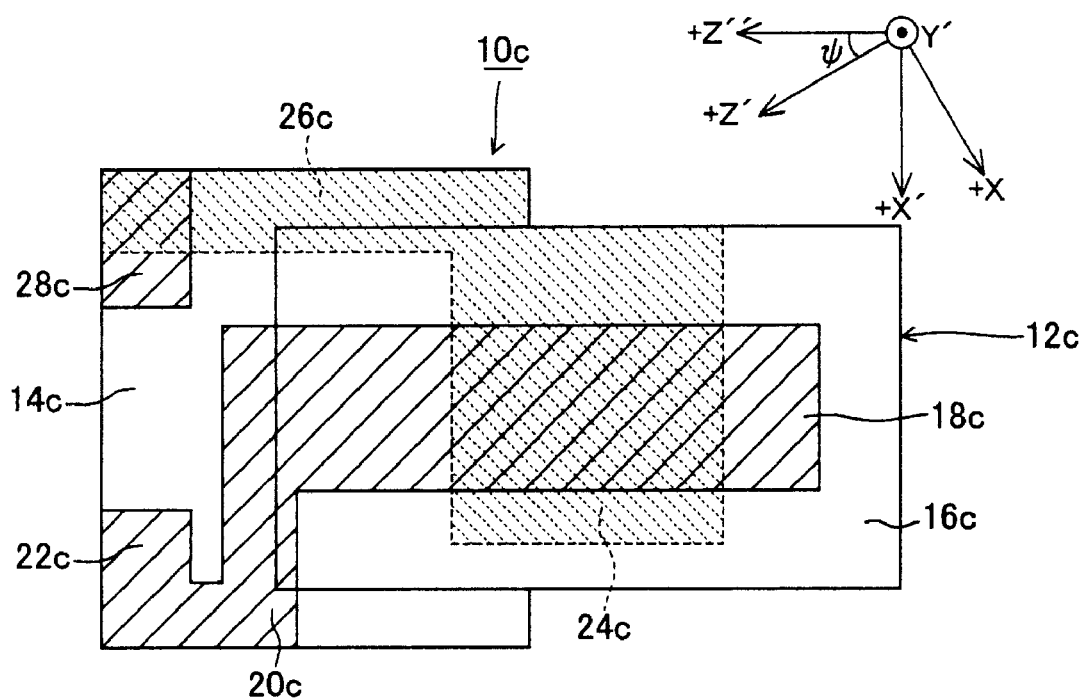
FIG. 30 is a diagram showing a modified example of the quartz crystal resonator element according to the fourth embodiment.

Next, a modification of the fourth embodiment will be described with reference to FIG. 30. The quartz crystal resonator element 10c according to the modification has almost the same structure as that of the resonator element 10c of the fourth embodiment described above, excepting that the thick section 14c is formed in an I-letter shape at an end of the thin resonating section 16c. The thick section 14c arranged only on a fixed-end side (a base-end of the +Z"-axis) in the fourth embodiment is extended up to a predetermined midway position of the resonating section 16c in a square C-letter shape in the present modification.

The above structure can be particularly effective, for example, when the resonating section 16c is made relatively large or when the resonating section 16c has an extremely small thickness, thereby reinforcing a mechanical strength of the resonating section 16c. The quartz crystal resonator element 10c having the above structure can be regarded as a modified example of the fourth embodiment.

Figure 31A:
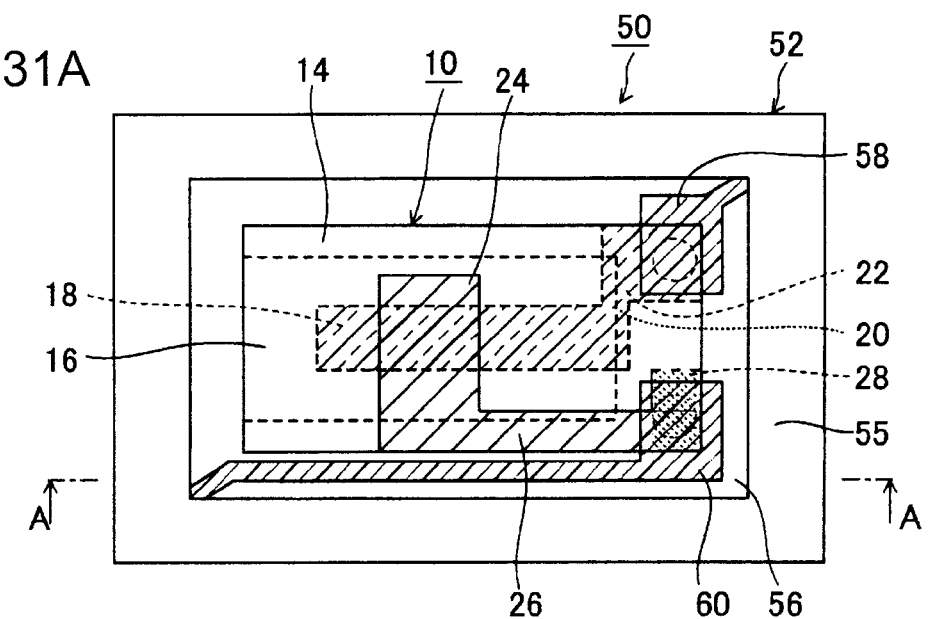
FIGS. 31A and 31B are diagrams showing a structural example of a quartz crystal resonator as an example of a quartz crystal device according an embodiment of the invention.
Figure 31B:
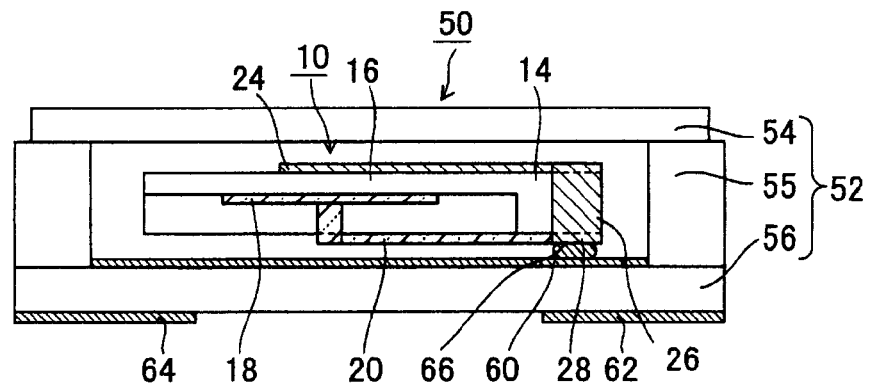

Next will be described a quartz crystal device according to an embodiment of the invention with reference to drawings. First, a quartz crystal resonator as an example of the quartz crystal device according to the embodiment will be described by referring to FIGS. 31A and 31B. FIG. 31A is a plan view (without a lid) of the quartz crystal resonator, and FIG. 31B is a sectional view taken along line A-A of FIG. 31A.

A quartz crystal resonator 50 according to the embodiment basically includes a package 52 and a quartz crystal resonator element disposed in the package 52.

In the present embodiment, the package 52 includes a substrate 56 as a base (a bottom plate), a seal ring 55 bonded to an upper surface of the substrate 56 to form a side wall, and a lid 54 sealing an upper opening.

On one of main surfaces of the substrate 56 as the bottom plate of the package 52 are arranged inner mounting terminals 58 and 60 for mounting the quartz crystal resonator element 10 and at least one other wiring pattern. On the other one of the main surfaces of the substrate 56 are arranged outer mounting terminals 62 and 64 for mounting the quartz crystal resonator 50 on another substrate or the like. The inner mounting terminals 58 and 60 are electrically connected to the outer mounting terminals 62 and 64.

The seal ring 55 has a linear expansion coefficient approximated to that of the substrate 56 and is preferably made of a metal or an alloy having a low melting point. For example, when the substrate 56 is made of ceramic, the seal ring 55 can be made of kovar. Additionally, it is only necessary for the lid 54 to be made of a flat plate serving as a cover body, and the lid 54 can be selected from various kinds of lids according to a purpose of use, such as a light-shielding glass lid or a conductive metallic lid. Preferably, the lid 54 is made of a material having a linear expansion coefficient approximated to that of a bonding member.

A quartz crystal resonator element mounted in the package 52 thus structured may be any one of the quartz crystal resonator elements 10 to 10c according to the first to the fourth embodiments (FIG. 31 shows the quartz crystal resonator element 10 as an example). The present embodiment includes the quartz crystal resonator element 10 in which the extraction electrode 26 is extended via a side surface of the quartz crystal substrate 12 and the two connection electrodes 22 and 28 are arranged on one of the main surfaces (the upper surface) of the resonator element.

The quartz crystal resonator element 10 thus structured is mounted on the inner mounting terminals 58 and 60 arranged on the substrate 56 via a conductive adhesive 66 or a conductive bonding member such as a bump.

In a method for producing the quartz crystal resonator 50 structured as above, first, the conductive adhesive 66 is applied to the inner mounting terminals 58 and 60 on the substrate 56 included in the package 52. Next, the connection electrodes 22 and 28 each are bonded to a top portion of the conductive adhesive 66 so as to mount the quartz crystal resonator element 10. After completion of the mounting of the quartz crystal resonator element 10, the upper opening is sealed with the lid 54 through various processes such as frequency adjustment. When the lid 54 is a metal lid, seam welding can be performed to seal the opening.

In the quartz crystal resonator 50 structured as above, there can be obtained an advantage that there is no need for top-coating of the conductive adhesive 66, in addition to effects dependent on the quartz crystal resonator element 10. Accordingly, even when side walls of a cavity are formed with the seal ring 55 made of a conductive alloy, it is unnecessary to maintain a large distance between a mounting position of the quartz crystal resonator element 10 and a position of the seal ring 55. Thus, the package 52 can be miniaturized. In addition, as the conductive bonding member for mounting the resonator element 10, a bump can be used because of a lower risk of disconnection than the conductive adhesive 66, whereby options for the mounting method can be increased and also resonating characteristics can be stabilized.

Furthermore, in the quartz crystal resonator element 10 used in the resonator 50, the connection electrodes 22 and 28 may be arranged on both of the upper and the lower surfaces of the quartz crystal substrate 12. In this case, the conductive adhesive 66 may be used to mount the quartz crystal resonator element 10 and to top-coat (See FIG. 32), so as to obtain electrical continuity between the upper and the lower surfaces of the quartz crystal substrate 12. The quartz crystal resonator element 10 thus structured can also be regarded as a part of the quartz crystal resonator of the present embodiment.

Figure 33:
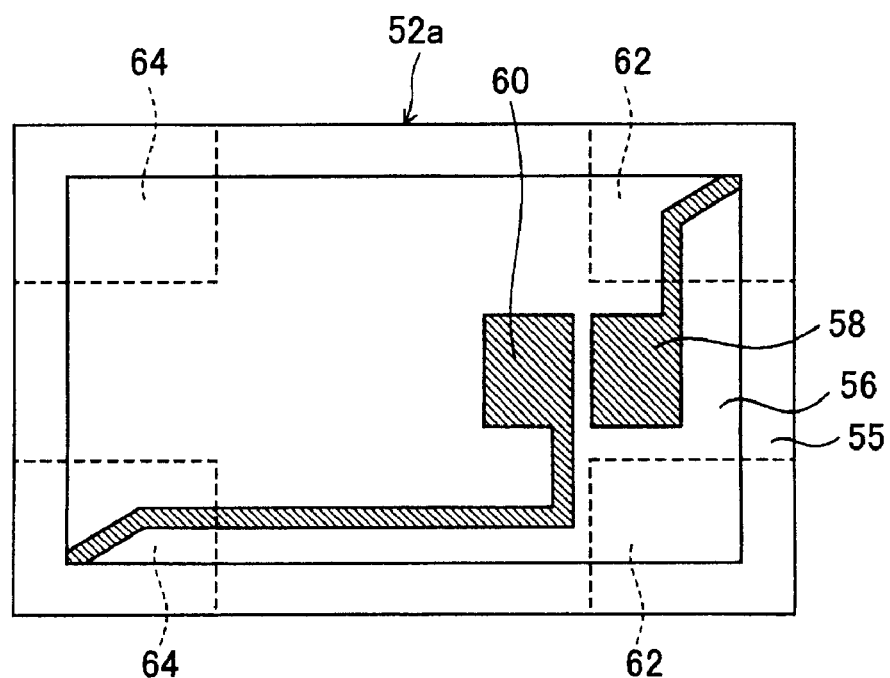
FIG. 33 is a diagram showing a package structure of the quartz crystal resonator when mounting the quartz crystal resonator element of the first embodiment including connection electrodes arranged along a Z" axis.

In addition, when using any one of the quartz crystal resonator elements 10 including the connection electrodes 22 and 28 arranged along the Z" axis, as shown in FIGS. 8 to 14, there may be used a package as shown in FIG. 33. In a package 52a of the drawing, the inner mounting terminals 58 and 60 are arranged along long-side directions of the package 52a. Arranging the inner mounting terminals 58 and 60 in the manner as in FIG. 33 enables the quartz crystal resonator element 10 to be mounted such that the connection electrodes 22 and 28 are arranged along the Z" axis obtained by rotating the Z' axis by −30°±5° about the Y' axis. Consequently, the quartz crystal resonator element 10 can be disposed fixedly at two points positioned in a direction having a lowest sensitivity against stress to quartz crystal. Therefore, stress loaded to the package or the like is little influential on frequency characteristics.

The above embodiment has described the quartz crystal resonator as an example of the quartz crystal device and an example of the quartz crystal resonator element suitable to the resonator. Alternatively, the quartz crystal device of the embodiment may be a quartz crystal filter. For example, for a quartz crystal resonator element as shown in FIGS. 34A and 34B, the quartz crystal device of the embodiment may be a dual-mode filter.

Figure 34A:
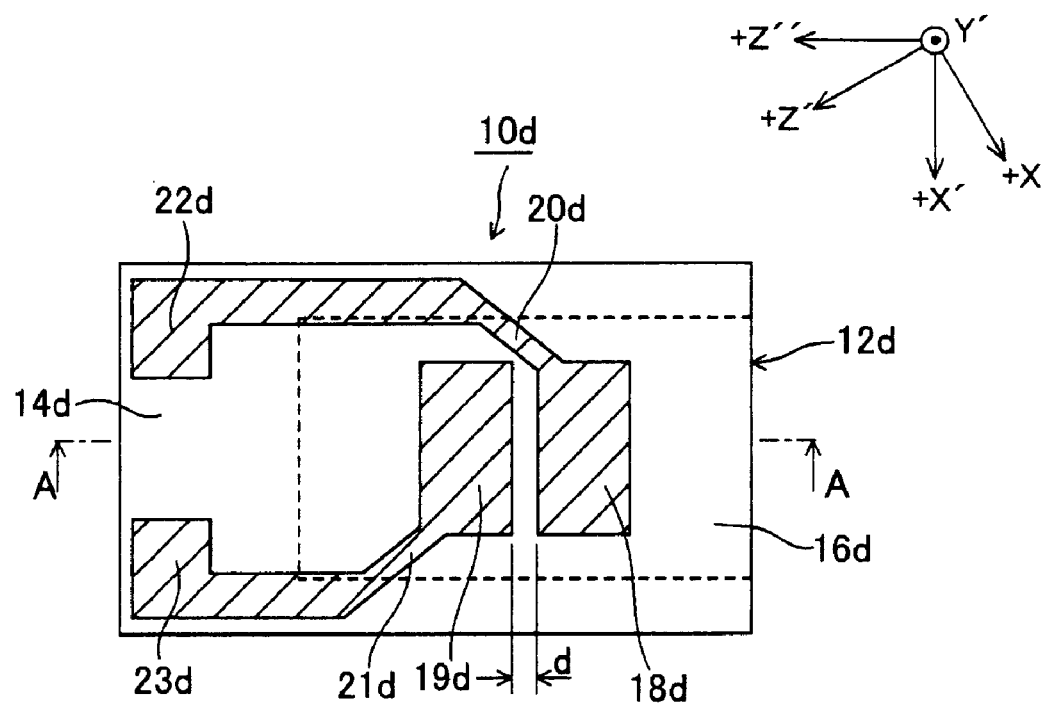
FIGS. 34A and 34B are diagrams showing a structure of a quartz crystal resonator element used in a dual-mode filter as another example of the quartz crystal device according to the embodiment of the invention.
Figure 34B:
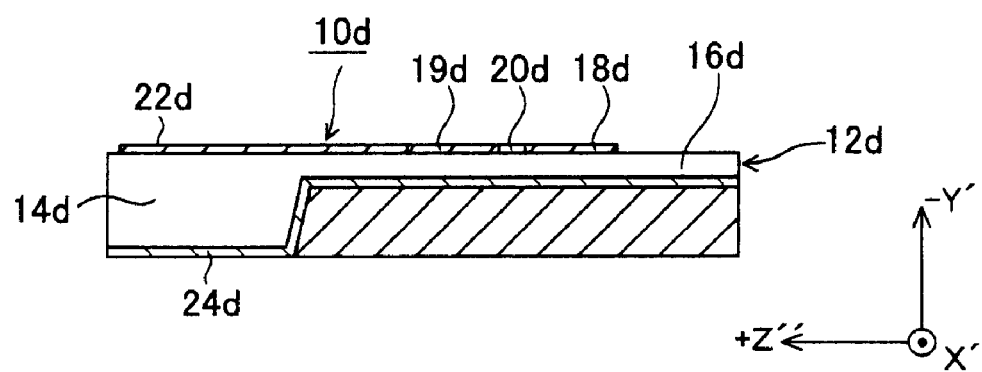

In a quartz crystal resonator element 10$d$ used in the filter, a quartz crystal substrate 12$d$ may be the same as the substrate used in the quartz crystal resonator elements 10 to 10$c$ according to the first to the fourth embodiments (FIGS. 34A and 34B exemplify the same one as that in the quartz crystal resonator element 10). An electrode pattern arranged on each of the upper and the lower surfaces of the quartz crystal substrate 12$d$ only needs to be formed as follows: an electrode 24$d$ is formed entirely on one of main surfaces (for example, a main surface on which wet etching is performed to form the resonating section 16$d$), and two excitation electrodes 18$d$ and 19$d$, two connection electrodes 22$d$ and 23$d$ and extraction electrodes 20$d$ and 21$d$ are formed on the other one of the main surfaces (on a flat main surface, for example). The extraction electrodes 20$d$ and 21$d$ electrically connect the excitation electrodes 18$d$ and 19$d$ to the connection electrodes 22$d$ and 23$d$.

The excitation electrodes 18$d$ and 19$d$ are both arranged on the resonating section 16$d$ formed as a thin section. The two excitation electrodes 18$d$ and 19$d$, respectively, are set to individually excite vibration at a zero-order symmetric vibration mode (S0 mode) and vibration at a zero-order anti-symmetric vibration mode (A0 mode). When resonance frequencies at the respective vibration modes are represented by fs and fa, respectively, a passband width of the dual-mode filter is equal to approximately twice a difference between the two resonance frequencies (a value of fa−fs). The resonance frequencies fs and fa change depending on a thickness of the resonating section 16, amounts of frequency reduction in the excitation electrodes 18$d$ and 19$d$, and a distance "d" between the two excitation electrodes 18$d$ and 19$d$. The quartz crystal device thus structured can be regarded as an example of the quartz crystal device according to the embodiment.

FIGS. 34A and 34B show an example of a two-pole monolithic crystal filter (MCF) with the two excitation electrodes 18$d$ and 19$d$ arranged on the single quartz crystal substrate 12$d$. However, the number of the excitation electrodes arranged is not restricted to two but may be three or more. For example, in FIGS. 34A and 34B, the electrode 24$d$ formed entirely on one of the main surfaces is divided into two electrodes to provide two excitation electrodes opposing one of the two electrodes 24$d$ so as to constitute the two-pole MCF, and to provide a single excitation electrode opposing the other one of the electrodes 24$d$ so as to constitute a quartz crystal resonator. Alternatively, although it is obvious, there may be constituted a four-pole MCF with the two-pole MCF at two stages, or a combination of a single two-pole MCF and two quartz crystal resonators. As described above, various availabilities can be obtained by allowing the resonating section to be made large to increase a space for the resonating section on the quartz crystal substrate.

Figure 35:
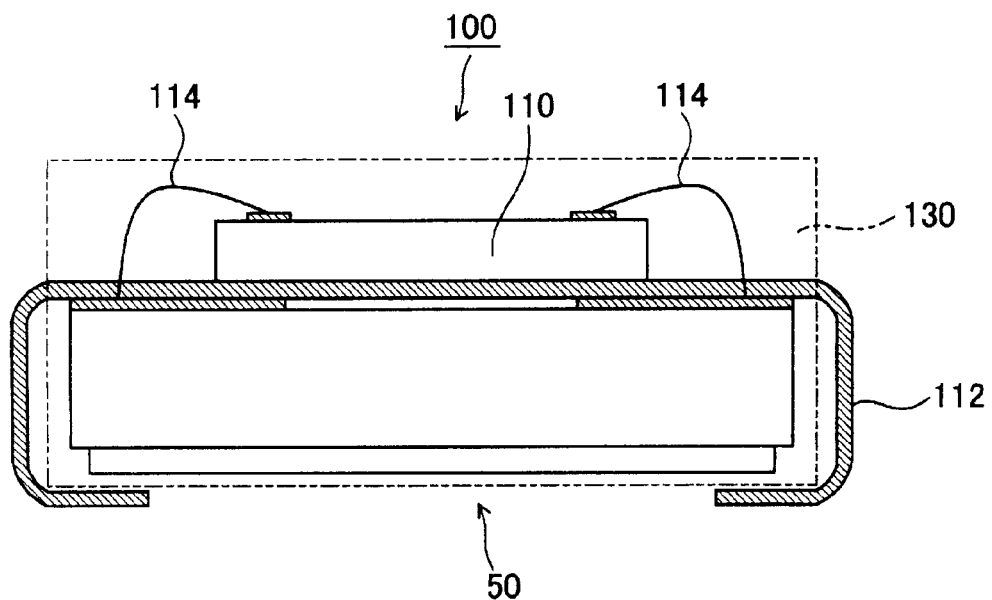
FIG. 35 is a diagram showing a structural example of a quartz crystal oscillator according to a first embodiment of the invention, as another example of the quartz crystal device of the embodiment.

Next, a description will be given of a quartz crystal oscillator according to an embodiment of the invention by referring to drawings. First will be described a quartz crystal oscillator according to a first embodiment of the invention with reference to FIG. 35.

Figure 32:
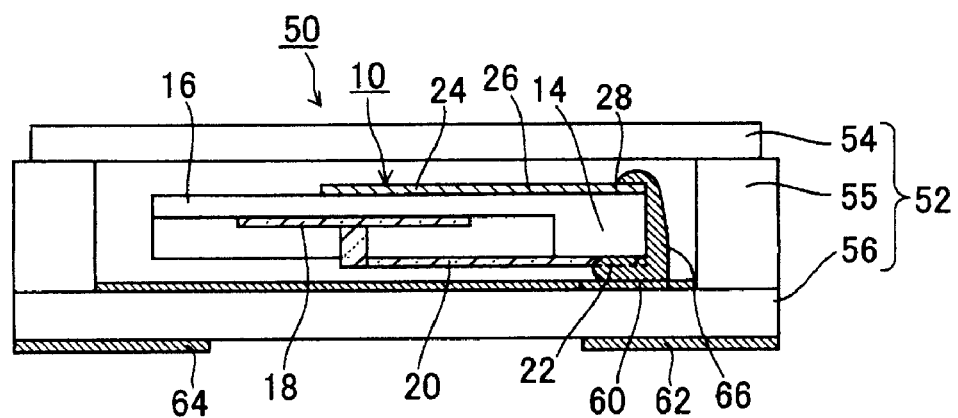
FIG. 32 is a diagram showing another structural example of the quartz crystal resonator according to the embodiment.

A quartz crystal oscillator 100 according to the first embodiment uses the quartz crystal resonator 50 shown in FIGS. 31 and 32 without any modification. The quartz crystal oscillator 100 includes an IC 110 including a lead frame 112 and an oscillation circuit, in addition to the quartz crystal resonator 50.

Specifically, the IC 110 is mounted on an upper surface of the lead frame 112, and the quartz crystal resonator 50 is mounted, in a reversed manner, on a lower surface of the lead frame 112. Then, the metal wire 114 connects the lead frame 112 to the IC 110 and connects the quartz crystal resonator 50 to the IC 110.

Additionally, in the quartz crystal oscillator 100 thus structured, an entire region except for tips of the lead frame 112 bearing outer mounting terminals is molded with a resin material 130 to protect an active surface of the IC 110, the metal wire 114, and connecting portions.

Next will be described a quartz crystal oscillator according to a second embodiment of the invention with reference to FIG. 36.

Figure 36:
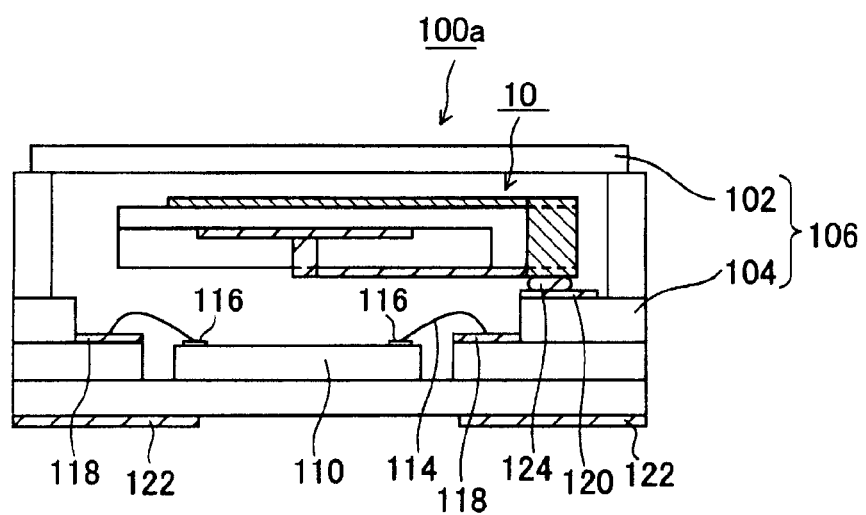
FIG. 36 is a diagram showing a structure of a quartz crystal oscillator according to a second embodiment of the invention, as another example of the crystal device of the embodiment.

In a quartz crystal oscillator 100*a* according to the second embodiment, as shown in FIG. 36, a single package 106 includes the IC 110 and the quartz crystal resonator element 10. In the embodiment shown in FIG. 36, for miniaturization of the quartz crystal oscillator, the quartz crystal resonator element 10 and the IC 110 are arranged so as to vertically overlap with each other. Specifically, a cavity of a package base 104 is formed in a stepped shape to mount the IC 110 on a bottom plate located on a bottom step. On a step immediately above the bottom step having the IC 110 mounted thereon is provided an inner terminal 118 to electrically connect the IC 110 to the package base 104. Additionally, a terminal 116 is provided on the active surface of the IC 110 to be connected to the inner terminal 118 in the package base 104 by the metal wire 114. Then, on a step next above the step having the inner terminal 118 thereon is provided an inner mounting terminal 120 used for mounting the quartz crystal resonator element 10. The resonator element 10 is mounted via a conductive adhesive 124. After mounting the resonator element 10, an upper opening of the package base 104 is sealed with a lid 102.

Figure 37:
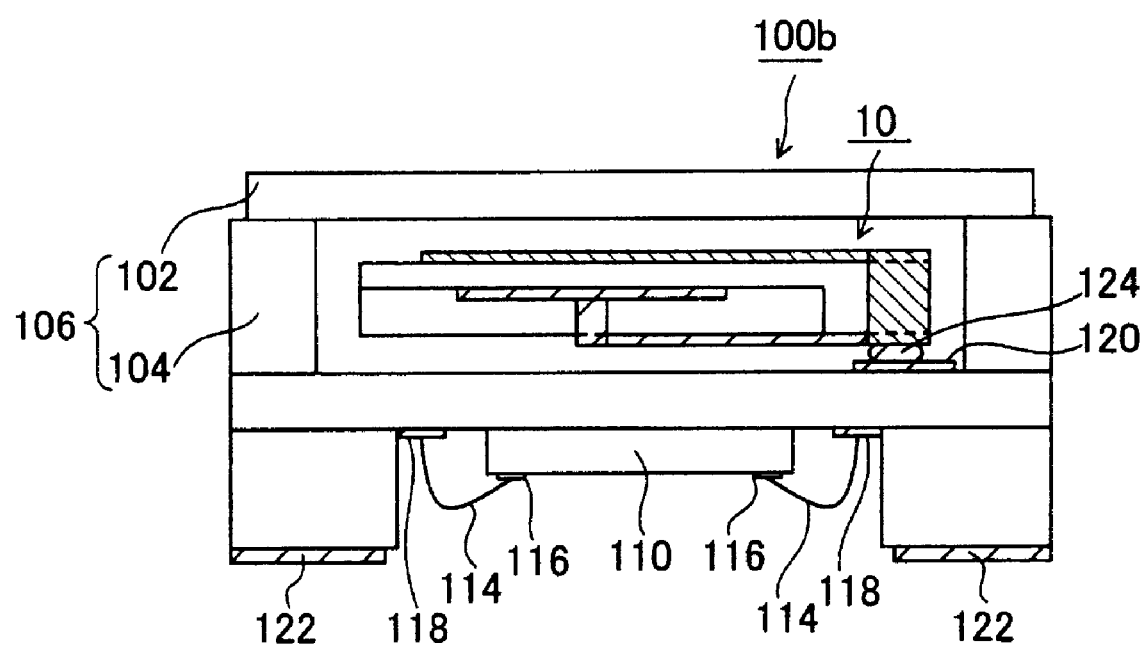
FIG. 37 is a diagram showing a structural of a quartz crystal oscillator according to a third embodiment of the invention.

FIG. 37 shows a quartz crystal oscillator according to a third embodiment of the invention. A quartz crystal oscillator 100*b* shown in FIG. 37 includes the package base 104 having a so-called H-shaped section. In the quartz crystal oscillator 100*b*, the quartz crystal resonator element 10 is mounted in one of cavities provided in upper and lower regions, and the cavity is sealed with the lid 102, as well as the IC 110 is mounted in the other one of the cavities. The quartz crystal oscillator 100*b* as above can also be regarded as an example that embodies the invention.

The entire disclosure of Japanese Patent Application No. 2007-341003, filed Dec. 12, 2007 is expressly incorporated by reference herein.

What is claimed is:

1. A quartz crystal resonator element, comprising:
an AT-cut quartz crystal substrate, the substrate having edges parallel to each of a Z" axis obtained by rotating a Z' axis in a range of −120° to −60° about a Y' axis and an X' axis perpendicular to the Z" axis when an angle formed by rotating a +Z' axis in a direction of a +X axis about the Y' axis is a positive rotation angle;
a thin section that forms a resonating section; and
a thick section adjacent to the resonating section, the thin section and the thick section being formed on the quartz crystal substrate by wet etching, wherein the thin section is formed either on a main surface of the substrate corresponding to a +Y'-axis side or on a main surface of the substrate corresponding to a −Y'-axis side;
and when the thin section is formed by the etching on the main surface of the +Y'-axis side, the thick section is provided at least a +Z"-axis-side end of the thin section, whereas when the thin section is formed by the etching on the main surface of the −Y'-axis side, the thick section is provided at least a −Z"-axis-side end of the thin section, wherein there is provided a non-thick-section-forming region at least one end of the thin section except for the end of the thin section at which the thick section is formed.

2. A quartz crystal resonator element, comprising:
an AT-cut quartz crystal substrate, the substrate having edges parallel to each of a Z" axis obtained by rotating a Z' axis in a range of +40° to +60° about a Y' axis and an X' axis perpendicular to the Z" axis when an angle formed by rotating a +Z' axis in a direction of a +X axis about the Y' axis is a positive rotation angle;
a thin section that forms a resonating section; and
a thick section adjacent to the resonating section, the thin section and the thick section being formed on the quartz crystal substrate by wet etching, wherein the thin section is formed either on a main surface of the substrate corresponding to a +Y'-axis side or on a main surface of the substrate corresponding to a −Y'-axis side;
and when the thin section is formed by the etching on the main surface of the +Y'-axis side, the thick section is provided at least a +Z"-axis-side end of the thin section, whereas when the thin section is formed by the etching on the main surface of the −Y'-axis side, the thick section is provided at least a −Z"-axis-side end of the thin section, wherein there is provided a non-thick-section-forming region at least one end of the thin section except for the end of the thin section at which the thick section is formed.

3. The quartz crystal resonator element according to claim 1 further including a plurality of excitation electrodes formed on the resonating section provided on one of the main surfaces of the substrate.

4. A quartz crystal device including the quartz crystal resonator element according to claim 1.

5. A quartz crystal device including the quartz crystal resonator element according to claim 3.

6. A quartz crystal device including the quartz crystal resonator element according to claim 1 and an oscillation circuit that allows excitation of the quartz crystal resonator element.

7. A quartz crystal device including the quartz crystal resonator element according to claim 3 and an oscillation circuit that allows excitation of the quartz crystal resonator element.

8. The quartz crystal resonator element according to claim 2 further including a plurality of excitation electrodes formed on the resonating section provided on one of the main surfaces of the substrate.

9. A quartz crystal device including the quartz crystal resonator element according to claim 2.

10. A quartz crystal device including the quartz crystal resonator element according to claim 2 and an oscillation circuit that allows excitation of the quartz crystal resonator element.

11. A quartz crystal device including the quartz crystal resonator element according to claim 8.

12. A quartz crystal device including the quartz crystal resonator element according to claim 8 and an oscillation circuit that allows excitation of the quartz crystal resonator element.

* * * * *